United States Patent
Yamada

(10) Patent No.: US 10,269,950 B2
(45) Date of Patent: Apr. 23, 2019

(54) COMPOUND SEMICONDUCTOR SUBSTRATE AND FABRICATION METHOD THEREFOR, COMPOUND SEMICONDUCTOR DEVICE AND FABRICATION METHOD THEREFOR, POWER SUPPLY APPARATUS AND HIGH-OUTPUT AMPLIFIER

(71) Applicant: FUJITSU LIMITED, Kawasaki-shi, Kanagawa (JP)

(72) Inventor: Atsushi Yamada, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 17 days.

(21) Appl. No.: 15/676,451

(22) Filed: Aug. 14, 2017

(65) Prior Publication Data

US 2018/0090603 A1 Mar. 29, 2018

(30) Foreign Application Priority Data

Sep. 28, 2016 (JP) .................. 2016-189942

(51) Int. Cl.
*H01L 29/15* (2006.01)
*H01L 31/0256* (2006.01)
(Continued)

(52) U.S. Cl.
CPC ...... *H01L 29/7787* (2013.01); *H01L 21/0254* (2013.01); *H01L 21/0262* (2013.01); *H01L 21/02378* (2013.01); *H01L 21/02458* (2013.01); *H01L 21/02505* (2013.01); *H01L 23/3171* (2013.01); *H01L 29/04* (2013.01); *H01L 29/201* (2013.01); *H01L 29/205* (2013.01); *H01L 29/66462* (2013.01); *H01L 29/7786* (2013.01); *H03F 1/3247* (2013.01); *H03F 3/195* (2013.01); *H03F 3/245* (2013.01); *H01L 23/3107* (2013.01); *H01L 23/3114* (2013.01); *H01L 23/4952* (2013.01); *H01L 23/49513* (2013.01); *H01L 23/49562* (2013.01); *H01L 24/06* (2013.01); *H01L 24/45* (2013.01); *H01L 24/48* (2013.01); *H01L 24/49* (2013.01); *H01L 29/2003* (2013.01); *H01L 2224/0603* (2013.01);
(Continued)

(58) Field of Classification Search
USPC ............ 257/76, 183, 200, 201, 94, E29.091, 257/E33.025, E33.014, 114, 188, 189, 257/451, 85, 90, 192, 194, 285; 438/107, 438/191, 47, 604, 167, 172
See application file for complete search history.

(56) References Cited

U.S. PATENT DOCUMENTS

2003/0203604 A1* 10/2003 Makita ............... H01L 21/0242
 438/571
2012/0126293 A1 5/2012 Sumiya et al.
(Continued)

FOREIGN PATENT DOCUMENTS

| JP | 2001-230407 | 8/2001 |
|---|---|---|
| WO | 2011-016304 | 2/2011 |
| WO | 2013-125126 | 8/2013 |

*Primary Examiner* — Niki H Nguyen
(74) *Attorney, Agent, or Firm* — Fujitsu Patent Center

(57) ABSTRACT

A compound semiconductor substrate includes a substrate, a channel layer provided over the substrate, a nitride semiconductor layer provided over the channel layer, and a barrier layer provided on the nitride semiconductor layer. The length of the c axis of the nitride semiconductor layer is 0.4990 nm or more.

13 Claims, 22 Drawing Sheets

(51) Int. Cl.
    *H01L 29/778* (2006.01)
    *H01L 29/205* (2006.01)
    *H01L 29/04* (2006.01)
    *H01L 29/66* (2006.01)
    *H01L 21/02* (2006.01)
    *H01L 29/201* (2006.01)
    *H03F 1/32* (2006.01)
    *H03F 3/195* (2006.01)
    *H03F 3/24* (2006.01)
    *H01L 23/31* (2006.01)
    *H01L 29/20* (2006.01)
    *H01L 23/495* (2006.01)
    *H02M 1/42* (2007.01)
    *H03F 3/20* (2006.01)
    *H03F 3/189* (2006.01)
    *H01L 23/00* (2006.01)

(52) U.S. Cl.
    CPC ............... *H01L 2224/45124* (2013.01); *H01L 2224/48247* (2013.01); *H01L 2224/48257* (2013.01); *H01L 2224/48472* (2013.01); *H01L 2224/4903* (2013.01); *H01L 2924/181* (2013.01); *H02M 1/4208* (2013.01); *H02M 1/4225* (2013.01); *H03F 3/189* (2013.01); *H03F 3/20* (2013.01); *H03F 2200/451* (2013.01); *Y02B 70/126* (2013.01)

(56) References Cited

U.S. PATENT DOCUMENTS

2013/0168734 A1* 7/2013 Miyoshi ............ H01L 29/7787
                                               257/190
2013/0256685 A1* 10/2013 Ohki .................... H01L 29/778
                                                257/76
2014/0361337 A1 12/2014 Sugiyama et al.

\* cited by examiner

COMPOUND SEMICONDUCTOR SUBSTRATE AND FABRICATION METHOD THEREFOR, COMPOUND SEMICONDUCTOR DEVICE AND FABRICATION METHOD THEREFOR, POWER SUPPLY APPARATUS AND HIGH-OUTPUT AMPLIFIER

CROSS-REFERENCE TO RELATED APPLICATION

This application is based upon and claims the benefit of priority of the prior Japanese Patent Application No. 2016-189942, filed on Sep. 28, 2016, the entire contents of which are incorporated herein by reference.

FIELD

The embodiments discussed herein are related to a compound semiconductor substrate and a fabrication method therefor, a compound semiconductor device and a fabrication method therefor, a power supply apparatus and a high-power amplifier.

BACKGROUND

A nitride semiconductor device has characteristics such as a high saturation electron velocity, a wide band gap and so forth. Development of a high voltage withstanding and high output device is being performed lively utilizing the characteristics.

As a nitride semiconductor device that is used in such a high voltage withstanding and high output device as just described, a field effect transistor, especially, a high electron mobility transistor (HEMT), is available.

For example, an HEMT (AlGaN-HEMT) in which an AlGaN barrier layer is stacked on a GaN channel layer is available. Further, also research for an HEMT (InAlN-HEMT) in which an InAlN barrier layer is stacked on a GaN channel layer is being performed.

SUMMARY

According to one aspect of the embodiment, a compound semiconductor substrate includes a substrate, a channel layer provided over the substrate, a nitride semiconductor layer provided over the channel layer, and a barrier layer provided on the nitride semiconductor layer, wherein a length of a c axis of the nitride semiconductor layer is 0.4990 nm or more.

According to another aspect of the embodiment, a compound semiconductor device includes a substrate, a channel layer provided over the substrate, a nitride semiconductor layer provided over the channel layer, a barrier layer provided on the nitride semiconductor layer, and a gate electrode, a source electrode and a drain electrode provided over the barrier layer, wherein a length of a c axis of the nitride semiconductor layer is 0.4990 nm or more.

According to a further aspect of the embodiment, a power supply apparatus includes a transistor chip, wherein the transistor chip includes a substrate, a channel layer provided over the substrate, a nitride semiconductor layer provided over the channel layer, a barrier layer provided on the nitride semiconductor layer, and a gate electrode, a source electrode and a drain electrode provided over the barrier layer, wherein a length of a c axis of the nitride semiconductor layer is 0.4990 nm or more.

According to a still further aspect of the embodiment, a high-output amplifier includes an amplifier that amplifies an inputting signal, wherein the amplifier includes a transistor chip, the transistor chip includes a substrate, a channel layer provided over the substrate, a nitride semiconductor layer provided over the channel layer, a barrier layer provided on the nitride semiconductor layer, and a gate electrode, a source electrode and a drain electrode provided over the barrier layer, wherein a length of a c axis of the nitride semiconductor layer is 0.4990 nm or more.

According to a yet further aspect of the embodiment, a fabrication method for a compound semiconductor substrate includes forming a channel layer over a substrate, forming a nitride semiconductor layer over the channel layer, forming a barrier layer on the nitride semiconductor layer, wherein in the forming the nitride semiconductor layer, the nitride semiconductor layer is formed at a growth rate of 12 nm/min or more using TMAl or TEAl and $NH_3$ as precursors (material gases) by a MOVPE method.

According to a yet further aspect of the embodiment, a fabrication method for a compound semiconductor substrate includes forming a channel layer over a substrate, forming a nitride semiconductor layer over the channel layer, forming a barrier layer on the nitride semiconductor layer, wherein in the forming the nitride semiconductor layer, the nitride semiconductor layer is formed at a V/III ratio of 1000 or more and a growth rate of 8 nm/min or more using TMAl or TEAl and $NH_3$ as precursors by a MOVPE method.

According to a yet further aspect, there is provided a fabrication method for a compound semiconductor device, including forming a channel layer over a substrate, forming a nitride semiconductor layer over the channel layer, forming a barrier layer on the nitride semiconductor layer, and forming a gate electrode, a source electrode and a drain electrode over the barrier layer, wherein in the forming the nitride semiconductor layer, the nitride semiconductor layer is formed at a growth rate of 12 nm/min or more using TMAl or TEAl and $NH_3$ as precursors by a MOVPE method.

According to a yet further aspect of the embodiment, a fabrication method for a compound semiconductor device includes forming a channel layer over a substrate, forming a nitride semiconductor layer over the channel layer, forming a barrier layer on the nitride semiconductor layer, and forming a gate electrode, a source electrode and a drain electrode over the barrier layer, wherein in the forming the nitride semiconductor layer, the nitride semiconductor layer is formed at a V/III ratio of 1000 or more and a growth rate of 8 nm/min or more using TMAl or TEAl and $NH_3$ as precursors by a MOVPE method.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENTS

Incidentally, in such an HEMT as described above, a nitride semiconductor layer is sometimes provided as a spacer layer between a channel layer and a barrier layer.

In this case, it has been turned out that the nitride semiconductor layer as the spacer layer is not flattened sufficiently and the flatness of the surface of the barrier layer grown on the nitride semiconductor layer is degraded and the sheet resistance increases, and this makes a primary factor of disruption of increase of the output power.

It is an object of the embodiment to implement a flattened surface to reduce the sheet resistance thereby to allow achievement of high output power.

In the following, a compound semiconductor substrate and a fabrication method therefor, a compound semiconductor device and a fabrication method therefor, a power supply apparatus and a high-power amplifier according to the embodiments are described with reference to the drawings.

First Embodiment

First, a compound semiconductor substrate and a fabrication method therefor and a compound semiconductor device and a fabrication method therefor according to the first embodiment are described with reference to FIGS. 1 to 19.

The compound semiconductor device according to the present embodiment is a high voltage withstanding and high output device for which a nitride semiconductor material is used. It is to be noted that this is referred to also as nitride semiconductor device.

Further, the present compound semiconductor device includes a field-effect transistor for which a nitride semiconductor material is used. It is to be noted that this is referred to also as nitride semiconductor field-effect transistor. It is to be noted that the present compound semiconductor device may include a diode for which a nitride semiconductor material is used.

In the description of the present embodiment, a compound semiconductor device is described taking, as an example, a device including an HEMT (InAlN-HEMT) that includes a semiconductor stacked structure (HEMT) in which an InAlN barrier layer is stacked on a GaN channel layer. It is to be noted that the semiconductor stacked structure is referred to also as nitride semiconductor stacked structure or compound semiconductor stacked structure.

Figure 1:
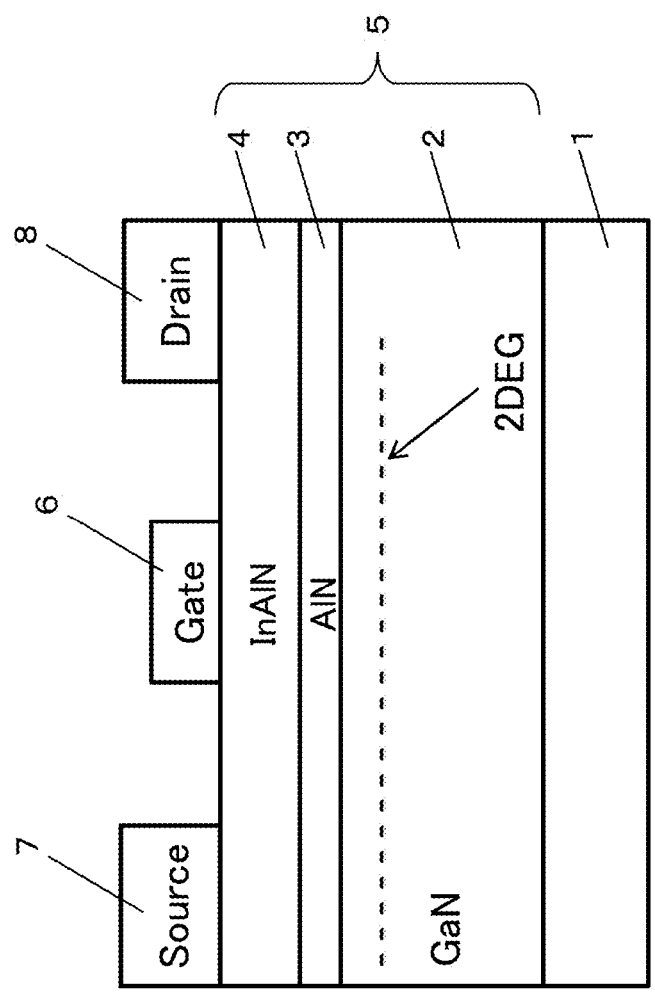
FIG. 1 is a schematic sectional view depicting a configuration of a compound semiconductor substrate and a compound semiconductor device according to a first embodiment.

As depicted in FIG. 1, the InAlN-HEMT of the present embodiment includes a semiconductor stacked structure 5 in which a GaN channel layer (electron transit layer) 2, an AlN spacer layer (nitride semiconductor layer) 3, and an InAlN barrier layer (barrier layer; electron supplying layer) 4 are stacked over a substrate 1 and further includes a gate electrode 6, a source electrode 7 and a drain electrode 8 provided over the semiconductor stacked structure 5.

In this case, two-dimensional electron gas (2 DEG) is generated in the proximity of an interface between the GaN channel layer 2 and the AlN spacer layer 3.

Here, the GaN channel layer 2, AlN spacer layer 3 and InAlN barrier layer 4 sometimes contain some other element (chemical element).

Therefore, the GaN channel layer 2, namely, a channel layer configured from GaN, and the channel layer additionally containing some other element are collectively referred to as "channel layer containing GaN".

Further, the AlN spacer layer 3, namely, a spacer layer configured from AlN, and the spacer layer 3 additionally containing some other element are collectively referred to as "spacer layer containing AlN". For example, since the AlN spacer layer 3 is formed on the GaN channel layer 2, the AlN spacer layer 3 sometimes contains Ga as some other element. In this case, the spacer layer 3 is an $Al_{x3}Ga_{1-x3}N$ ($0 < x3 \leq 1$) spacer layer (spacer layer configured from AlN or AlGaN, namely, spacer layer at least containing AlN). It is to be noted that the spacer layer 3 containing AlN is referred to also as nitride semiconductor layer containing AlN.

Further, the InAlN barrier layer 4, namely, a barrier layer configured from InAlN, and the barrier layer additionally containing some other element are collectively referred to as "barrier layer containing InAlN".

Figure 2:
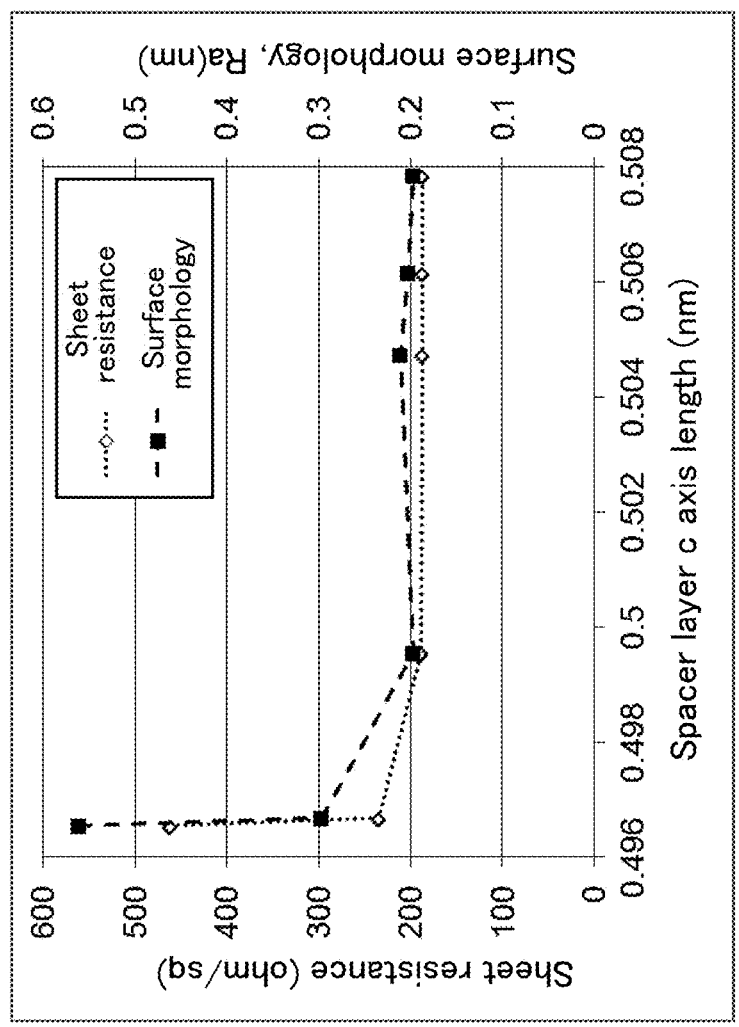
FIG. 2 is a view illustrating a length of a c axis of a spacer layer in the compound semiconductor substrate and compound semiconductor device according to the first embodiment.

Especially, in the present embodiment, the length of a c axis of the AlN spacer layer 3 that is a nitride semiconductor layer, namely, the length of a c axis of crystal configuring the AlN spacer layer 3, is 0.4990 nm or more as depicted in FIG. 2.

Consequently, it is possible to implement a flattened surface (for example, whose arithmetic average roughness Ra that indicates surface morphology is 0.25 nm or less) and reduce the sheet resistance (for example, to 200 ohm/sq or less). In other words, the InAlN-HEMT in which the sheet resistance is low and the surface morphology is good can be implemented. In this case, the arithmetic average roughness Ra of the surface of the barrier layer 4 is 0.25 nm or less.

It is to be noted that an object in which the semiconductor stacked structure 5 is provided on the substrate 1 is referred to as compound semiconductor substrate. In this case, the compound semiconductor device includes a compound semiconductor substrate, and the gate electrode 6, source electrode 7 and drain electrode 8 provided over the compound semiconductor substrate (here, over the barrier layer 4).

In particular, in the present embodiment, the compound semiconductor substrate includes the substrate 1, channel layer 2 provided over the substrate 1, nitride semiconductor layer (spacer layer) 3 provided over the channel layer 2 and barrier layer 4 provided on the nitride semiconductor layer (spacer layer) 3, and the length of the c axis of the nitride semiconductor layer (spacer layer) 3 is 0.4990 nm or more.

Further, in the present embodiment, the compound semiconductor device includes the substrate 1, channel layer 2 provided over the substrate 1, nitride semiconductor layer (spacer layer) 3 provided over the channel layer 2, barrier layer 4 provided on the nitride semiconductor layer (spacer layer) 3, and the gate electrode 6, source electrode 7 and drain electrode 8 provided over the barrier layer 4, and the length of the c axis of the nitride semiconductor layer (spacer layer) 3 is 0.4990 nm or more.

It is to be noted that, while the barrier layer 4 is configured as a barrier layer containing InAlN here, the present technology is not limited to this, and the barrier layer 4 may be any barrier layer only if it contains $In_{x1}Al_{y1}Ga_{1-x1-y1}N$ ($0<x1<0.20$, $0<y1\leq1$).

Further, in the present embodiment, the thickness of the AlN spacer layer 3 as the nitride semiconductor layer is 2 nm or less. Consequently, it can be prevented that the sheet resistance increases.

Figure 9:
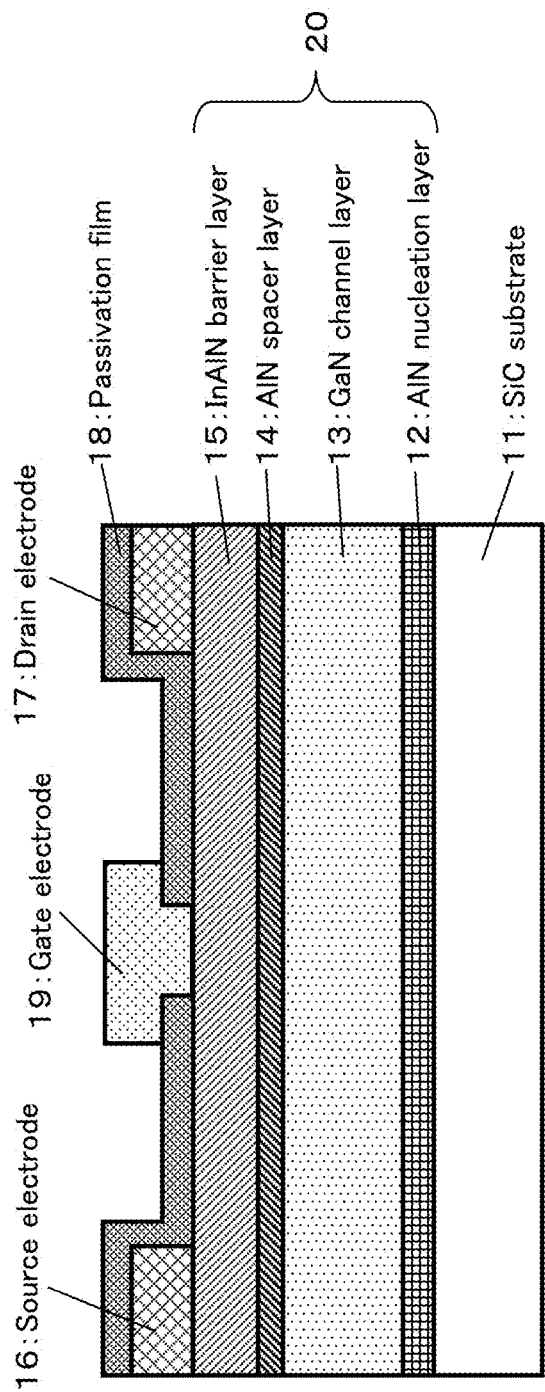
FIG. 9 is a schematic sectional view illustrating the compound semiconductor substrate and the fabrication method therefor and the compound semiconductor device and the fabrication method therefor of the particular example of the first embodiment.
Figure 13:
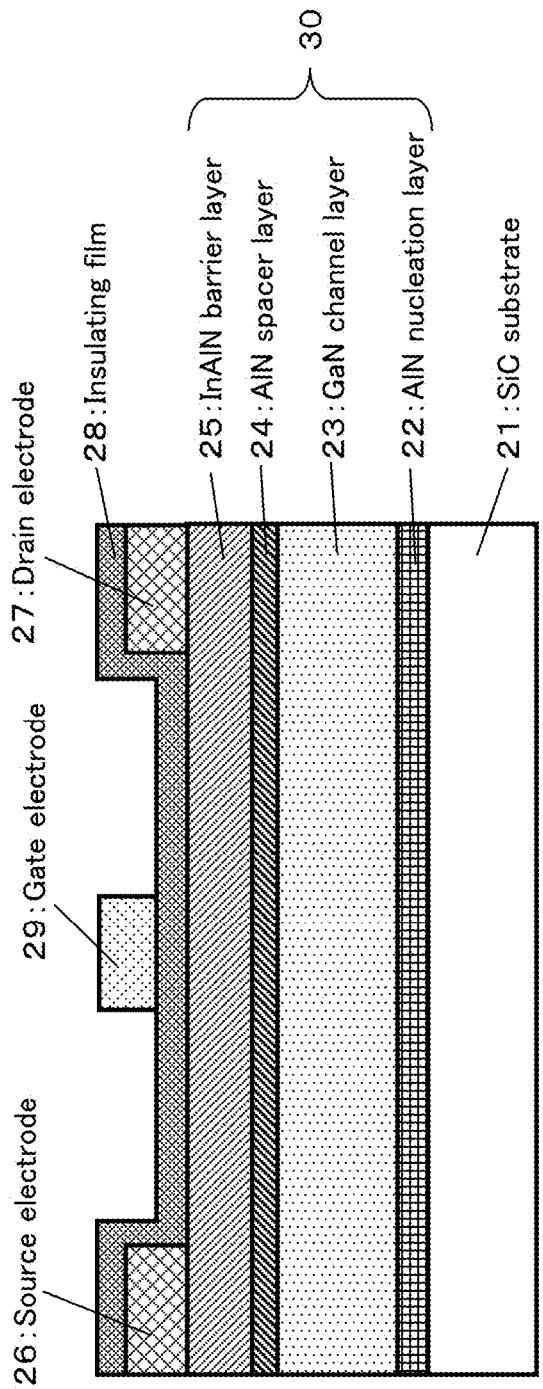
FIG. 13 is a schematic sectional view illustrating the compound semiconductor substrate and the fabrication method therefor and the compound semiconductor device and there fabrication method therefor of the first modification to the first embodiment.
Figure 19:
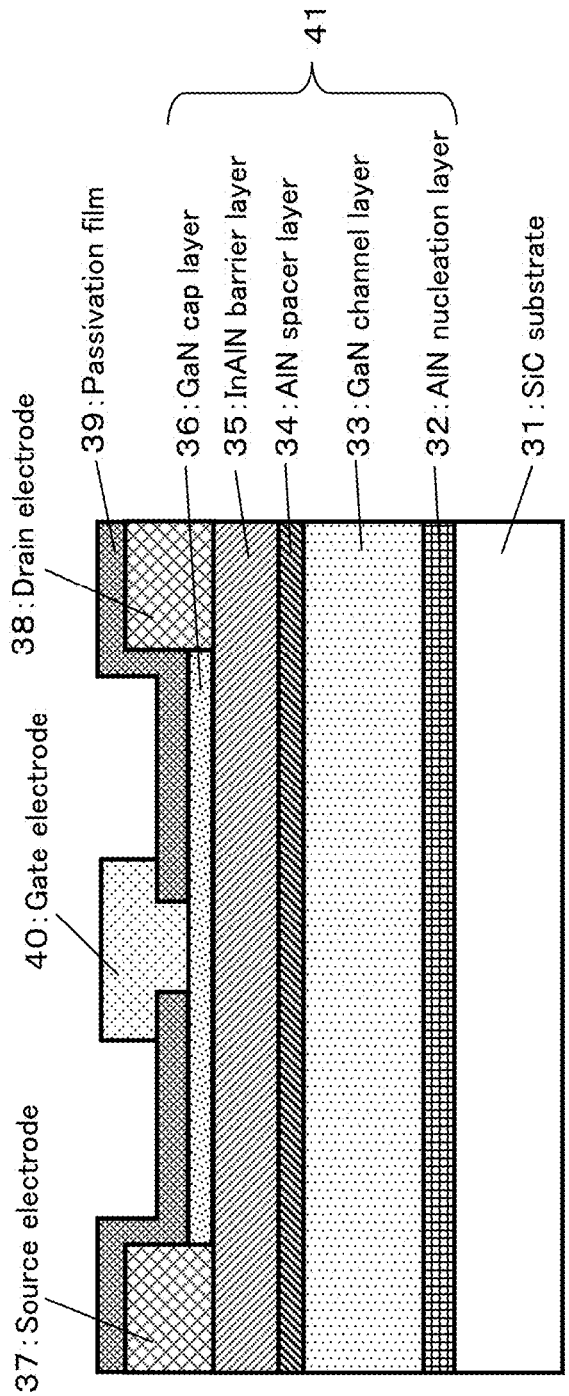
FIG. 19 is a schematic sectional view illustrating the compound semiconductor substrate and the fabrication method therefor and the compound semiconductor device and the fabrication method therefor of the second modification to the first embodiment.

It is to be noted that, in the compound semiconductor device described above, an insulating film may be provided on the semiconductor stacked structure 5 in such a manner as to cover the overall surface (for example, refer to FIG. 9, 13 or 19). In this case, the compound semiconductor device may be configured such that an opening is provided in the insulating film and the gate electrode 6 is provided in the opening so as to allow the gate electrode 6 to contact with the barrier layer 4 such that the compound semiconductor device has a Schottky gate structure. Or, the compound semiconductor device may be configured such that the gate electrode 6 is provided on the insulating film so as to provide the gate electrode 6 on the barrier layer 4 through the insulating film such that the compound semiconductor device has a MIS gate structure.

Further, in the compound semiconductor device described above, a cap layer may be provided on the barrier layer 4 (for example, refer to FIG. 19). In this case, the cap layer may be a cap layer containing $In_{x2}Al_{y2}Ga_{1-x2-y2}N$ ($0<x2<0.1$, $0<y2\leq0.05$).

Incidentally, the compound semiconductor substrate or the compound semiconductor device in which the length of the c axis of the AlN spacer layer 3 as the nitride semiconductor layer is 0.4990 nm or more as described above can be fabricated in the following manner.

Figure 3:
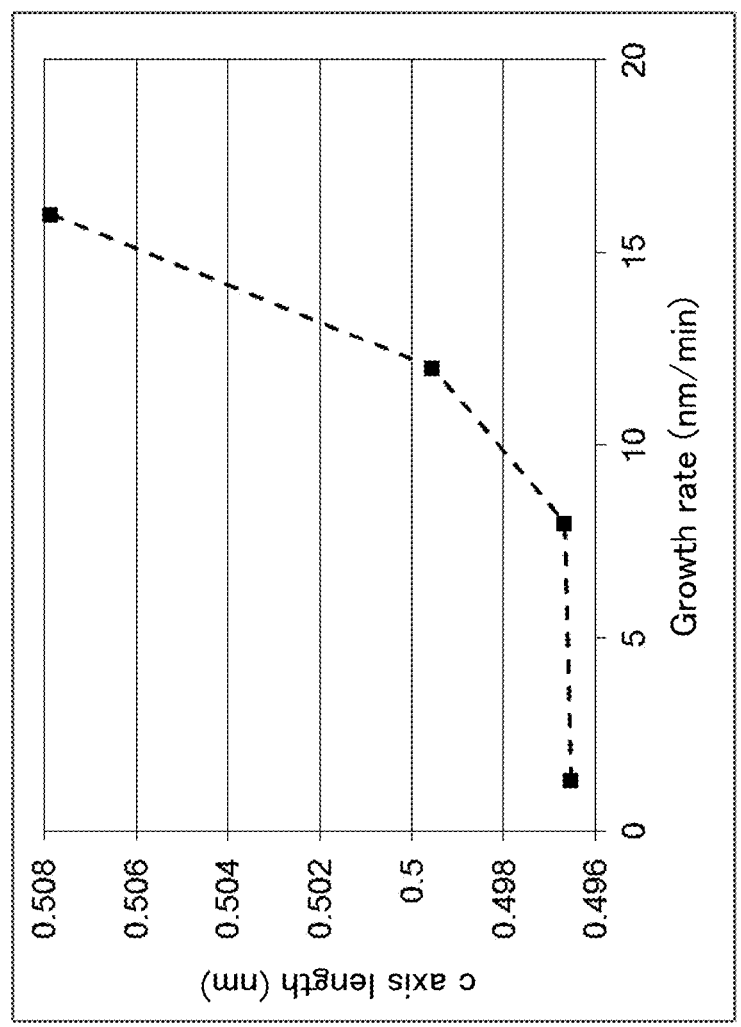
FIGS. 3 and 4 are views illustrating a fabrication method for a compound semiconductor substrate and a fabrication method for a compound semiconductor device according to the first embodiment.

First, according to a first method, an AlN spacer layer 3 as a nitride semiconductor layer is grown by a growth rate of 12 nm/min or more as depicted in FIG. 3 using TMAl or TEAl and NH$_3$ as precursors by the MOVPE method. By this method, a compound semiconductor substrate or a compound semiconductor device in which the length of the c axis of the AlN spacer layer 3 as the nitride semiconductor layer is 0.4990 nm or more can be implemented.

To this end, the fabrication method for a compound semiconductor substrate in the present embodiment includes a step of forming a channel layer 2 over a substrate 1, a step of forming a nitride semiconductor layer (spacer layer) 3 over the channel layer 2 and a step of forming a barrier layer 4 on the nitride semiconductor layer (spacer layer) 3, and, at the step of forming a nitride semiconductor layer (spacer layer) 3, the nitride semiconductor layer (spacer layer) 3 is formed by a growth rate of 12 nm/min or more using TMAl or TEAl and NH$_3$ as precursors by the MOVPE method (for example, refer to FIGS. 1 to 3).

Meanwhile, the fabrication method for a compound semiconductor device in the present embodiment includes a step of forming a channel layer 2 over a substrate 1, a step of forming a nitride semiconductor layer (spacer layer) 3 over the channel layer 2, a step of forming a barrier layer 4 on the nitride semiconductor layer (spacer layer) 3 and a step of forming a gate electrode 6, a source electrode 7 and a drain electrode 8 over the barrier layer 4, and, at the step of forming a nitride semiconductor layer (spacer layer) 3, the nitride semiconductor layer (spacer layer) 3 is formed at a V/III ratio of 1000 or more and a growth rate 8 nm/min or more using TMAl or TEAl and NH$_3$ as precursors by the MOVPE method (for example, refer to FIGS. 1 to 3).

Figure 4:
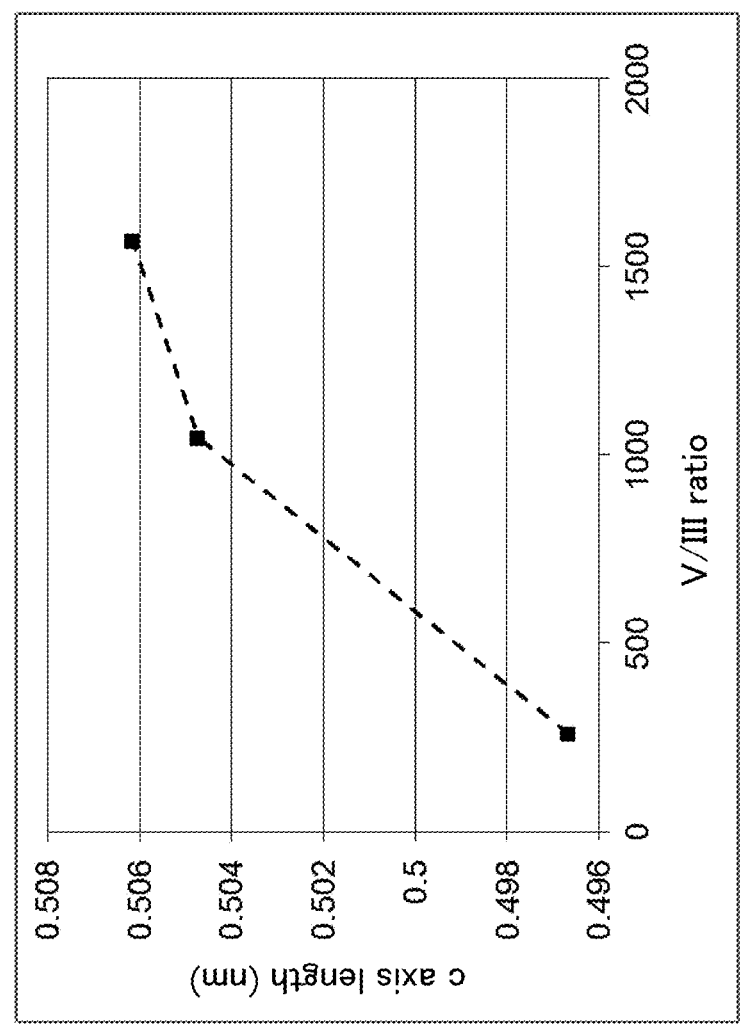

Subsequently, according to a second method, the AlN spacer layer 3 as a nitride semiconductor layer is grown at a V/III ratio of 1000 or more and a growth rate of 8 nm/min or more as depicted in FIGS. 3 and 4 using TMAl or TEAl and NH$_3$ as precursors by the MOVPE method. By this method, a compound semiconductor substrate or a compound semiconductor device in which the length of the c axis of the AlN spacer layer 3 as the nitride semiconductor layer is 0.4990 nm or more can be implemented.

To this end, the fabrication method for a compound semiconductor substrate according to the present embodiment includes a step of forming a channel layer 2 over a substrate 1, a step of forming a nitride semiconductor layer (spacer layer) 3 over the channel layer 2 and a step of forming a barrier layer 4 on the nitride semiconductor layer (spacer layer) 3, and, at the step of forming a nitride semiconductor layer (spacer layer) 3, the nitride semiconductor layer (spacer layer) 3 is formed by a V/III ratio of 1000 or more and a growth rate 8 nm/min or more using TMAl or TEAl and NH$_3$ as precursors by the MOVPE method (for example, refer to FIGS. 1 to 4).

Further, the fabrication method for a compound semiconductor device in the present embodiment includes a step of forming a channel layer 2 over a substrate 1, a step of forming a nitride semiconductor layer (spacer layer) 3 over the channel layer 2, a step of forming a barrier layer 4 on the nitride semiconductor layer (spacer layer) 3 and a step of forming a gate electrode 6, a source electrode 7 and a drain electrode 8 over the barrier layer 4, and, at step of forming the nitride semiconductor layer (spacer layer) 3, the nitride semiconductor layer (spacer layer) 3 is formed at a V/III ratio 1000 or more and a growth rate of 8 nm/min or more using TMAl or TEAl and NH$_3$ as precursors by the MOVPE method (for example, refer to FIGS. 1 to 4).

In this manner, in the fabrication method for a compound semiconductor substrate and the fabrication method for a compound semiconductor device according to the present embodiment, the spacer layer 3 is formed using only TMAl or TEAl and NH$_3$ as precursors. However, in the case where the AlN spacer layer 3 is formed, for example, on the GaN channel layer 2 in this manner, the AlN spacer layer 3 sometimes contains Ga. In this case, the AlN spacer layer 3 becomes an $Al_{x3}Ga_{1-x3}N$ (0<x3≤1) spacer layer (spacer layer configured from AlN or AlGaN, namely, spacer layer at least containing AlN).

It is to be noted that, at the step of forming a barrier layer 4 in the fabrication method for a compound semiconductor substrate or the fabrication method for a compound semiconductor device described above, when the barrier layer 4 containing $In_{x1}Al_{y1}Ga_{1-x1-y1}N$ (0<x1<0.20, 0<y1≤1) is formed, it is preferable to form the nitride semiconductor layer (spacer layer) 3 in such a manner as described above.

Further, in the fabrication method for a compound semiconductor substrate or the fabrication method for a compound semiconductor device described above, also at the step of forming a channel layer 2 and the step of forming a barrier layer 4, it is preferable to form the channel layer 2 and the barrier layer 4 by the MOVPE method.

Incidentally, the reason why the fabrication methods in the present embodiment are such as described above is described below.

In recent years, research for an InAlN-HEMT in which InAlN is used as a barrier layer has been and is being performed popularly.

It is known that InAlN lattice matches with GaN in In composition of 17 to 18%. Further, InAlN has very high spontaneous polarization in the composition region, and two-dimensional electron gas (2DEG) having a higher concentration than that of a conventional AlGaN-HEMT can be implemented. Therefore, the InAlN-HEMT is noticed as a high-power device in the next generation.

However, InAlN simultaneously has also high alloy scattering, and, if InAlN is formed directly on GaN, then the mobility of the 2DEG significantly decreases by alloy scattering. It is to be noted that there is a similar subject in the case where a barrier layer containing In, namely, a barrier layer containing $In_{x1}Al_{y1}Ga_{1-x1-y1}N$ (0<x1<0.20, 0<y1≤1) is used.

Therefore, it can be estimated that the alloy scattering is reduced by insertion of an AlN spacer layer (for example, refer to M. Gonschorek, J.-F. et al., "High electron mobility lattice-matched AlInN/GaN field-effect transistor heterostructures", Appl. Phys. Lett. 89, 062106 (2006), the entire content of which is incorporated herein by reference).

By inserting the AlN spacer layer to reduce alloy scattering in this manner, the mobility of the InAlN-HEMT increases significantly.

The mobility of the InAlN-HEMT is influenced significantly by the quality of the AlN spacer layer.

However, since a nitride semiconductor having a high Al composition is difficult in growth in that an optimum growth temperature is high, it is difficult to form an AlN spacer layer having high quality.

Therefore, it has been found that the AlN spacer layer is not flattened sufficiently and also the flatness of the surface of an InAlN barrier layer grown on the AlN spacer layer degrades remarkably. Further, it has been found that, by the degradation of the surface flatness, also the sheet resistance increases, and this makes a primary factor of disruption of increase of the output power.

It is to be noted that, where a spacer layer is inserted in an AlGaN-HEMT in which AlGaN is used as a barrier layer, since a spacer layer ($Al_{x3}Ga_{1-x3}N$ (0<x3≤1) spacer layer) having a higher Al composition than that of an AlGaN barrier layer is used, it is difficult to form a high-quality spacer layer similarly as in the case of the InAlN-HEMT described above, and there is a similar subject.

Therefore, in order to implement reduction of the sheet resistance and improvement of the surface morphology in an InAlGaN-based HEMT structure, the length of the c axis (c axis length) of the spacer layer as a nitride semiconductor layer (in the embodiment described above, an AlN spacer layer) is set to 0.4990 nm or more. It is to be noted that an ideal c axis length of AlN (bulk; document value) is 0.4982 nm. Consequently, a flattened surface (for example, an arithmetic average roughness Ra of the surface is 0.25 nm or less) can be implemented and the sheet resistance can be reduced (for example, reduced to 200 ohm/sq or less).

Further, such a spacer layer 3 as a nitride semiconductor layer having a c axis length of 0.4990 nm or more as described above (in the embodiment described above, an AlN spacer layer) is implemented by using TMAl (trimethyl aluminum) gas or TEAl (triethyl aluminum) gas that are Al sources and $NH_3$ (ammonia) that is an N source as raw materials as described above and forming a layer in accordance with growth conditions of a growth rate of 12 nm/min or more or a growth rate of 8 nm/min or more and besides a V/III ratio of 1000 or more.

As a result of an investigation performed taking such a subject as described above into consideration in this manner, it has been found out that a flattened surface can be implemented and reduction of the sheet resistance can be achieved by using TMAl or TEAl and $NH_3$ as precursors and forming the spacer layer 3 (in the embodiment described above, an AlN spacer layer) at a growth rate of 12 nm/min or more.

Further, it has been found out that the spacer layer 3 (in the embodiment described above, an AlN spacer layer) formed in such a manner as described above has a c axis length of 0.4990 nm or more.

Further, since the growth rate of 12 nm/min or more is very high, a further investigation has been performed taking that it is difficult to control the growth thickness into consideration, and as a result, it has been found out that, even if the growth rate is 8 nm/min or more, if a spacer layer is grown at a V/III ratio of 1000 or more, then a flattened surface can be implemented and reduction of the sheet resistance can be achieved similarly. Also in this case, it has been found out that the spacer layer 3 (in the embodiment described above, an AlN spacer layer) has a c axis length of 0.4990 nm or more.

Consequently, both of reduction of the sheet resistance and achievement of a flattened surface can be implemented. Further, increase of the output power can be implemented by reduction of the sheet resistance, and a flattened surface can be implemented by improvement of the surface morphology. Consequently, the reliability can be enhanced in terms of reduction of the gate leak current, enhancement of the withstanding voltage and so forth. The performance of the InAlGaN-based HEMT can be improved significantly in this manner.

A particular example is described below with reference to FIGS. 5 to 9.

In this particular example, as depicted in FIG. 9, a compound semiconductor substrate includes a semiconductor stacked structure 20 in which an AlN nucleation layer 12, a GaN channel layer 13, an AlN spacer layer 14 and an InAlN barrier layer 15 are stacked on a semi-insulating SiC substrate 11. Further, the compound semiconductor device is configured by providing a source electrode 16, a drain electrode 17 and a gate electrode 19 over the compound semiconductor substrate, namely, over the semiconductor stacked structure 20 (here, the InAlN barrier layer 15). Further, in this particular example, an insulating film (for example, an SiN film) as a passivation film 18 is provided on the semiconductor stacked structure 20 so as to cover the overall surface of the semiconductor stacked structure 20, and, by providing the gate electrode 19 at an opening provided in the passivation film 18, the gate electrode 19 contacts with the InAlN barrier layer 15 to implement Schottky junction.

Now, a fabrication method for the compound semiconductor substrate and a fabrication method for the compound semiconductor device of the particular example are described with reference to FIGS. 5 to 9.

Figure 5:
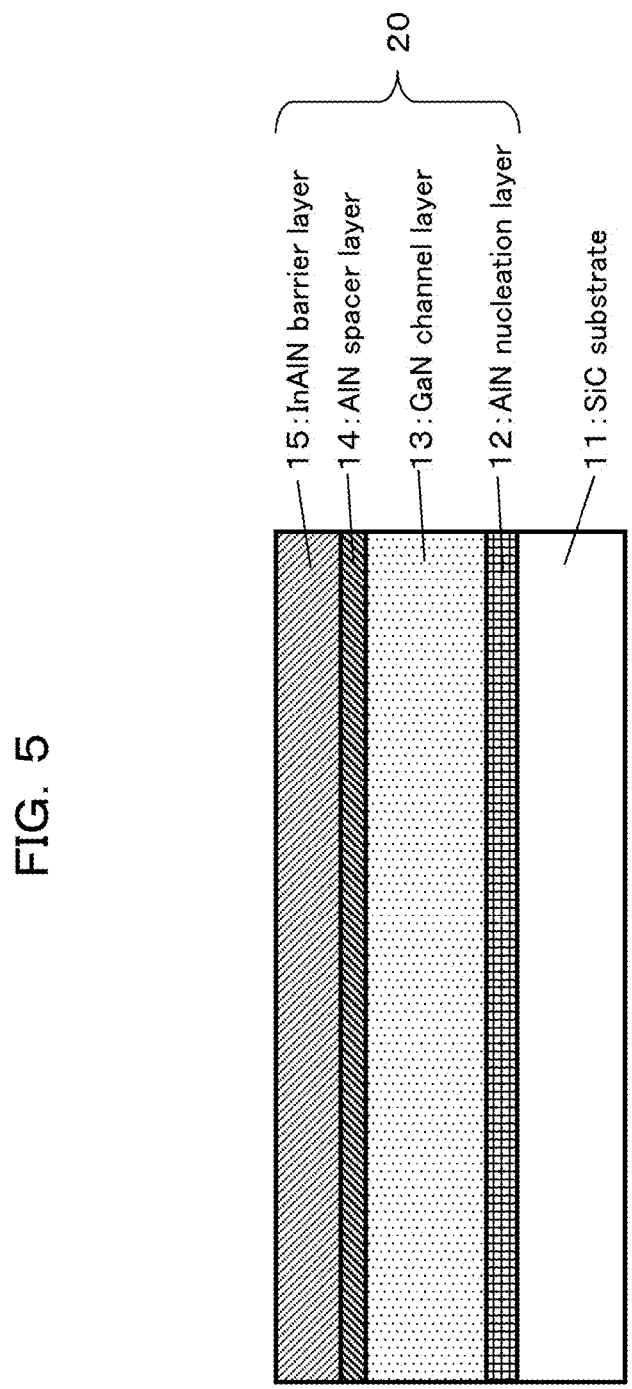
FIGS. 5 to 8 are schematic sectional views illustrating the fabrication method for a compound semiconductor substrate and the fabrication method for a compound semiconductor device of a particular example of the first embodiment.

First, as depicted in FIG. 5, an AlN nucleation layer 12, a GaN channel layer 13, an AlN spacer layer 14 and an InAlN barrier layer 15 are stacked on a semi-insulating SiC substrate 11, for example, by a MOVPE (Metal Organic Vapor Phase Epitaxy) method or the like to form a semiconductor stacked structure 20. A compound semiconductor substrate is formed thereby.

Here, the thickness of the AlN nucleation layer 12 is, for example, approximately 100 nm. Further, the thickness of the GaN channel layer 13 is, for example, approximately 3 μm. Further, the thickness of the AlN spacer layer 14 is, for example, approximately 1 nm. Further, the InAlN barrier layer 15 has a thickness of, for example, approximately 10 nm and an In composition of approximately 18% (namely, $In_{0.18}Al_{0.82}N$).

Further, for the growth of GaN, mixed gas of trimethyl gallium (TMGa) gas that is a Ga source and ammonia ($NH_3$) gas is used as precursor. Further, for the growth of AlN, mixed gas of trimethyl aluminum (TMAl) gas that is an Al source and $NH_3$ gas is used as precursor. Further, for the growth of InAlN, mixed gas of trimethyl indium (TMIn) gas, TMAl gas and $NH_3$ gas is used as precursor. Further, presence or absence of supply and a flow rate of the TMIn gas, TMAl gas and TMGa gas may be set suitably in response to a compound semiconductor substrate to be grown. Further, the growth pressure may be set to approximately 1 kPa to 100 kPa and the growth temperature may be set to approximately 700° C. to 1200° C.

Especially, the AlN spacer layer 14 here is formed using mixture gas of TMAl gas that is an Al source and $NH_3$ gas that is an N source as precursor in accordance with growth conditions of a growth rate of approximately 12 nm/min or more or a growth rate of approximately 8 nm/min or more and a V/III ratio of approximately 1000 or more. Further, a growth temperature is set between approximately 800° C. and approximately 1100° C., for example, to approximately 1000° C., and a growth pressure is set between approximately 1 kPa and approximately 15 kPa, for example, to approximately 10 kPa.

Then, though not depicted, a resist mask having an opening in an element isolation region is formed, for example, using a photolithography technology, and element isolation is performed using the resist mask, for example, by dry etching using chlorine-based gas or an ion implantation method.

Figure 6:
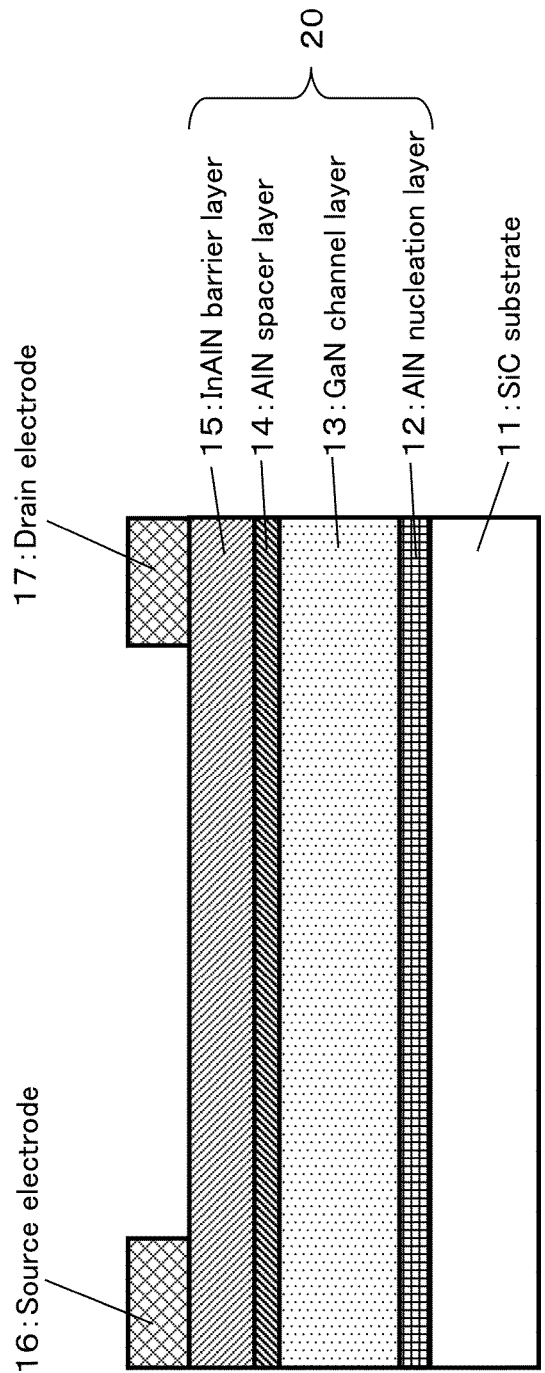

Then, a source electrode 16 and a drain electrode 17 are formed in a scheduled source electrode formation region and a scheduled drain electrode formation region, respectively, as depicted in FIG. 6, for example, using a photolithography technology and a vapor deposition/liftoff technology. In particular, a source electrode 16 and a drain electrode 17 made of Ta/Al are formed by stacking Ta and Al in order on the InAlN barrier layer 15. In this case, the thickness of Ta may be approximately 20 nm and the thickness of Al may be approximately 200 nm. Then, an ohmic characteristic is established by performing heat treatment at a temperature between approximately 400° C. and approximately 1000° C., for example, at 550° C., for example, within a nitride atmosphere.

Figure 7:
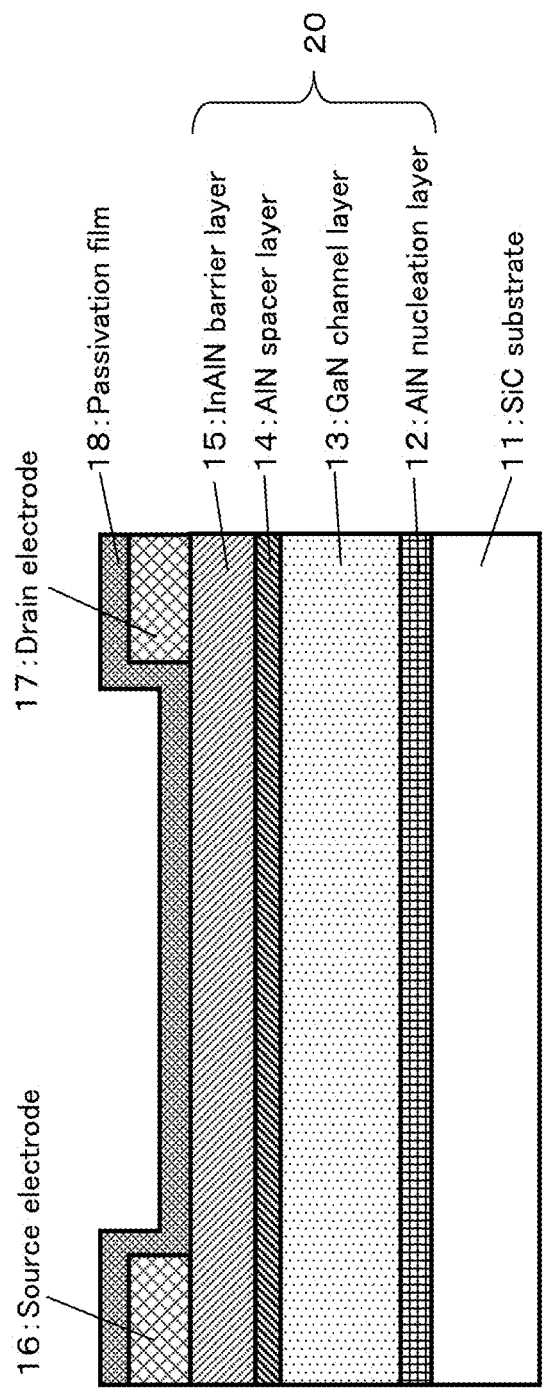

Then, as depicted in FIG. 7, a passivation film (insulating film) 18 on the overall face of the wafer, for example, using a plasma CVD method.

Here, the thickness of the passivation film 18 may be set between approximately 2 nm and approximately 500 nm, for example, to approximately 100 nm. Further, the passivation film 18 can be formed, for example, by using an ALD method, a plasma CVD method, a sputtering method or the like. Further, as a material of the passivation film 18, for example, an oxide, a nitride or an oxynitride of Si, Al, Hf, Zr, Ti, Ta or W can be used. For example, the passivation film 18 may be an SiN film.

Figure 8:
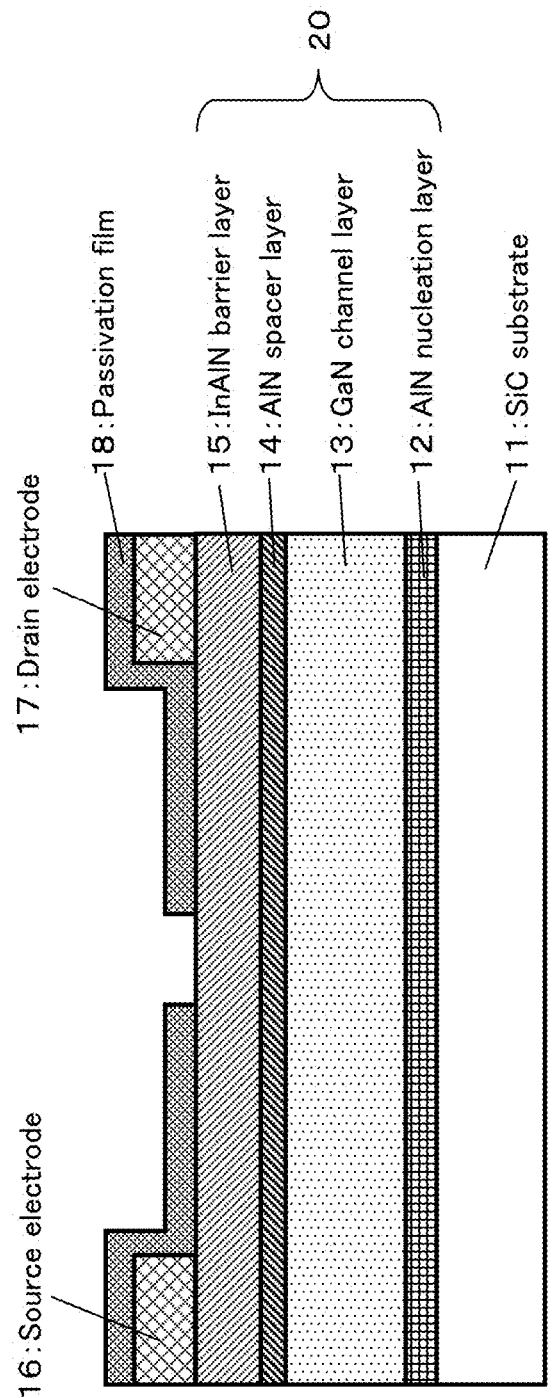

Then, a resist mask (not depicted) having an opening at part of the scheduled gate electrode formation region is formed, for example, using a photolithography technology. Then, using the resist mask, a passivation film 18 positioned at the opening is removed as depicted in FIG. 8, for example, by dry etching using fluorine-based gas or chlorine-based gas. It is to be noted that, as an etching technique, for example, wet etching using hydrofluoric acid, buffered hydrofluoric acid or the like may be performed.

Then, a gate electrode 19 is formed in the scheduled gate electrode formation region, for example, using a photolithography technology and a vapor deposition/liftoff technology as depicted in FIG. 9. In particular, the gate electrode 19 made of Ni/Al is formed by stacking Ni and Au in order on the InAlN barrier layer 15. In this case, the thickness of Ni may be, for example, approximately 30 nm and the thickness of Au may be, for example, approximately 400 nm. In this manner, the gate electrode 19 is formed in contact with the InAlN barrier layer 15 to establish Schottky joint.

Thereafter, though not depicted, a compound semiconductor device (InAlN-HEMT) is completed, for example, by forming a wiring line, a pad and so forth.

Accordingly, the compound semiconductor substrate and the fabrication method therefor as well as the compound semiconductor device and the fabrication method therefor according to the present embodiment have an effect that a flattened surface is implemented to reduce the sheet resistance and increase of the output power can be achieved.

It is to be noted that, while the compound semiconductor substrate and the fabrication method therefor as well as the compound semiconductor device and the fabrication method therefor of the above-described particular example are described taking those of the Schottky type gate structure as an example, they are not limited to those, and configurations and fabrication methods of modifications described below may be applied thereto.

First, a first modification is described with reference to FIGS. 10 to 13.

The first modification is different in that an MIS type gate structure is applied in place of the Schottky type gate structure as depicted in FIG. 13.

In the first modification, as depicted in FIG. 13, a compound semiconductor substrate has a semiconductor stacked structure 30 in which an AlN nucleation layer 22, a GaN channel layer 23, an AlN spacer layer 24 and an InAlN barrier layer 25 are stacked on a semi-insulating SiC substrate 21.

Then, a compound semiconductor device is fabricated by providing a source electrode 26, a drain electrode 27 and a gate electrode 29 over the compound semiconductor substrate, namely, over the semiconductor stacked structure 30 (here, the InAlN barrier layer 25).

Further, in the first modification, an insulating film 28 (for example, an Al$_2$O$_3$ film) that serves as a passivation film and a gate insulating film is provided on the semiconductor stacked structure 30 so as to cover the overall surface of the semiconductor stacked structure 30, and an MIS type gate structure is configured by providing the gate electrode 29 on the insulating film 28.

Now, a fabrication method for the compound semiconductor substrate and a fabrication method for the compound semiconductor device of the first modification are described with reference to FIGS. 10 to 13.

Figure 10:
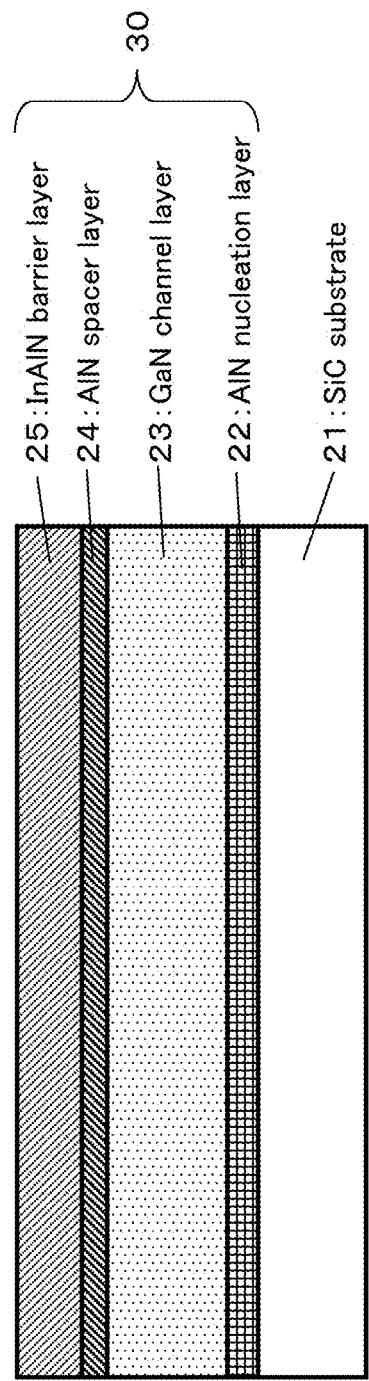
FIGS. 10 to 12 are schematic sectional views illustrating a fabrication method for a compound semiconductor substrate and a fabrication method for a compound semiconductor device of a first modification to the first embodiment.

First, as depicted in FIG. 10, an AlN nucleation layer 22, a GaN channel layer 23, an AlN spacer layer 24 and an InAlN barrier layer 25 are stacked in order on a semi-insulating SiC substrate 21, for example, by an MOVPE method or the like to form a semiconductor stacked structure 30. A compound semiconductor substrate is formed thereby.

Here, the thickness of the AlN nucleation layer 22 is, for example, approximately 100 nm. Further, the thickness of the GaN channel layer 23 is, for example, approximately 3 µm. Further, the thickness of the AlN spacer layer 24 is, for example, approximately 1 nm. Further, the InAlN barrier layer 25 has a thickness of, for example, approximately 10 nm and an In composition of approximately 18% (namely, In$_{0.18}$Al$_{0.82}$N).

Further, for the growth of GaN, mixed gas of trimethyl gallium (TMGa) that is a Ga source and ammonia (NH$_3$) gas is used as precursor. Further, for the growth of AlN, mixed gas of trimethyl aluminum (TMAl) gas that is an Al source and NH$_3$ gas is used as precursor. Further, for the growth of InAlN, mixed gas of trimethyl indium (TMIn) gas, TMAl gas and NH$_3$ gas is used as precursor. Further, presence or absence of supply and a flow rate of the TMIn gas, TMAl gas and TMGa gas may be set suitably in response to the compound semiconductor substrates to be grown. Further, the growth pressure may be set to approximately 1 kPa to 100 kPa and the growth temperature may be set to approximately 700° C. to 1200° C.

Especially, the AlN spacer layer 24 here is formed using mixed gas of TMAl gas that is an Al source and NH$_3$ gas that is an N source as precursor in accordance with growth conditions of a growth rate of approximately 12 nm/min or more or a growth rate of approximately 8 nm/min or more and a V/III ratio of approximately 1000 or more. Further, a growth temperature is set between approximately 800° C. and approximately 1100° C., for example, to approximately 1000° C., and a growth pressure is set between approximately 1 kPa and approximately 15 kPa, for example, to approximately 10 kPa.

Then, though not depicted, a resist mask having an opening in an element isolation region is formed, for example, using a photolithography technology, and element isolation is performed using the resist mask, for example, by dry etching using chlorine-based gas or an ion implantation method.

Figure 11:
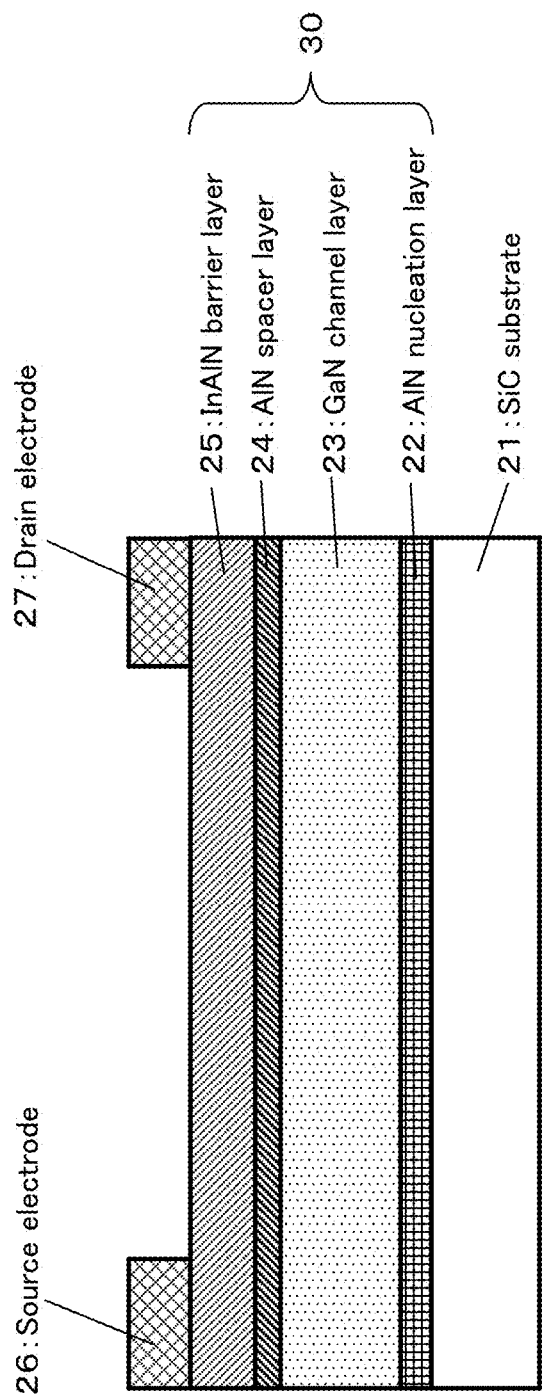

Then, a source electrode 26 and a drain electrode 27 are formed in a scheduled source electrode formation region and a scheduled drain electrode formation region, respectively, for example, using a photolithography technology and a vapor deposition/liftoff technology as depicted in FIG. 11. In particular, the source electrode 26 and the drain electrode 27 made of Ta/Al are formed by stacking Ta and Al in order on the InAlN barrier layer 25. In this case, the thickness of Ta may be approximately 20 nm and the thickness of Al may be approximately 200 nm. Then, an ohmic characteristic is established by performing heat treatment at a temperature between approximately 400° C. and approximately 1000° C., for example, at 550° C., for example, in a nitride atmosphere.

Figure 12:
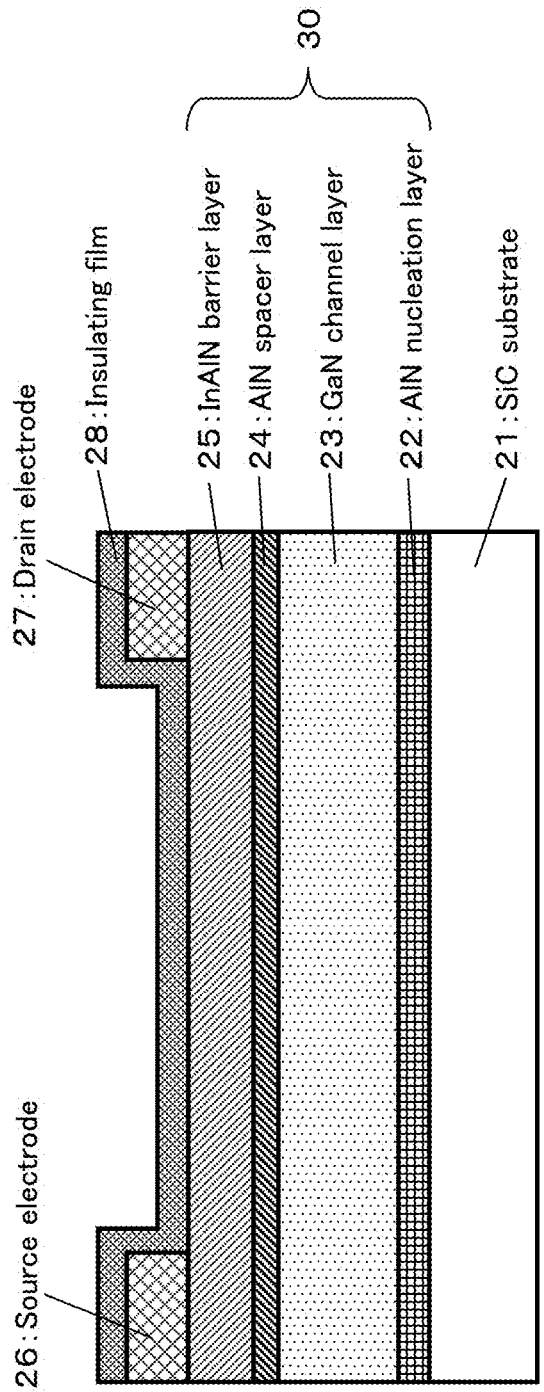

Then, as depicted in FIG. 12, an insulating film 28 that functions as a passivation film and a gate insulating film is formed on the overall face of the wafer, for example, using an ALD method.

Here, the thickness of the insulating film 28 may be set between approximately 2 nm and approximately 200 nm, for example, to approximately 20 nm. Further, although the insulating film 28 can be formed, for example, using an ALD method, a plasma CVD method, a sputtering method or the like, it is preferable to use an ALD method. Further, as a material of the passivation film 28, for example, an oxide, a nitride or an oxynitride of Si, Al, Hf, Zr, Ti, Ta or W can be used. For example, the insulating film 28 may be an Al$_2$O$_3$ film.

Then, a gate electrode 29 is formed in the scheduled gate electrode formation region as depicted in FIG. 13, for example, using a photolithography technology and a vapor deposition/liftoff technology. In particular, the gate electrode 29 made of Ni/Au is formed by stacking Ni and Au in order on the insulating film 28. In this case, the thickness of Ni may be, for example, approximately 30 nm and the thickness of Au may be, for example approximately 400 nm. In this manner, an MIS type gate structure is configured by providing the gate electrode 29 on the InAlN barrier layer 25 with the insulating film 28 interposed therebetween.

Thereafter, though not depicted, a compound semiconductor device (InAlN-HEMT) is completed, for example, by forming an interconnection, a pad and so forth.

Since the compound semiconductor substrate in the first modification has an MIS type gate structure, gate leak current can be reduced in comparison with that of the Schottky gate structure. Therefore, a high-efficiency HEMT can be implemented.

Now, a second modification is described with reference to FIGS. 14 to 19.

The second modification is different in that a GaN cap layer 36 is further provided as depicted in FIG. 19.

In the second modification, a compound semiconductor substrate has a semiconductor stacked structure 41 in which an AlN nucleation layer 32, a GaN channel layer 33, an AlN spacer layer 34, an InAlN barrier layer 35 and a GaN cap layer 36 are stacked on a semi-insulating SiC substrate 31 as depicted in FIG. 19.

Further, a source electrode 37, a drain electrode 38 and a gate electrode 40 are provided over the compound semiconductor substrate, namely, over the semiconductor stacked structure 41 (here, the InAlN barrier layer 35 and the GaN cap layer 36) to configure a compound semiconductor device.

Further, in the present second modification, an insulating film 39 (for example, an SiN film) as a passivation film is provided on the semiconductor stacked structure 41 so as to cover the overall surface of the semiconductor stacked structure 41, and, by providing the gate electrode 40 at an opening provided in the insulating film, the gate electrode 40 contacts with the GaN cap layer 36 to establish Schottky joint.

Now, a fabrication method for the compound semiconductor substrate and a fabrication method for the compound semiconductor device of the second modification are described with reference to FIGS. 14 to 19.

Figure 14:
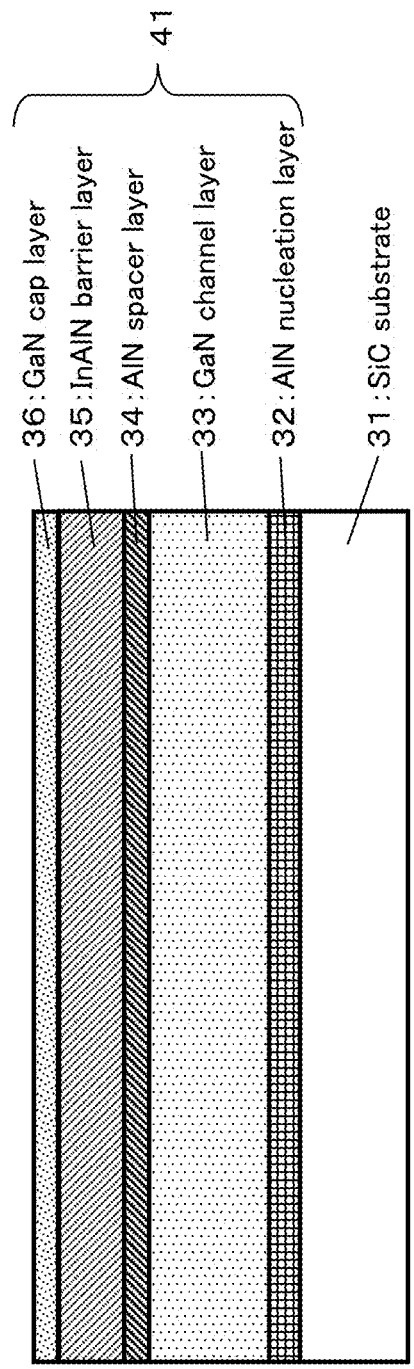
FIGS. 14 to 18 are schematic sectional views illustrating a fabrication method for a compound semiconductor substrate and a fabrication method for a compound semiconductor device of a second modification to the first embodiment.

First, as depicted in FIG. 14, a semiconductor stacked structure 41 is formed by stacking an AlN nucleation layer 32, a GaN channel layer 33, an AlN spacer layer 34, an InAlN barrier layer 35 and a GaN cap layer 36 in order on a semi-insulating SiC substrate 31, for example, by an MOVPE method or the like.

Here, the thickness of the AlN nucleation layer 32 is, for example, approximately 100 nm. Further, the thickness of the GaN channel layer 33 is, for example, approximately 3 μm. Further, the thickness of the AlN spacer layer 34 is, for example, approximately 1 nm. Further, the InAlN barrier layer 35 has a thickness of, for example, approximately 10 nm and an In composition of approximately 18% (namely, $In_{0.18}Al_{0.82}N$). Further, the thickness of the GaN cap layer 36 is, for example, approximately 4 nm.

Further, for the growth of GaN, mixed gas of trimethyl gallium (TMGa) gas that is a Ga source and ammonia ($NH_3$) gas is used as precursor. Further, for the growth of AlN, mixed gas of trimethyl aluminum (TMAl) gas that is an Al source and $NH_3$ gas is used as precursor. Further, for the growth of InAlN, mixed gas of trimethyl indium (TMIn) gas, TMAl gas and $NH_3$ gas is used as precursor. Further, presence or absence of supply and a flow rate of the TMIn gas, TMAl gas and TMGa gas may be set suitably in response to a compound semiconductor substrate to be grown. Further, the growth pressure may be set to approximately 1 kPa to 100 kPa and the growth temperature may be set to approximately 700° C. to 1200° C.

Especially, the AlN spacer layer 34 here is formed using mixed gas of TMAl gas that is an Al source and $NH_3$ gas that is an N source as precursor in accordance with a growth condition of a growth rate of approximately 12 nm/min or more or a growth rate of approximately 8 nm/min or more and a V/III ratio of approximately 1000 or more. Further, the growth temperature is set between approximately 800° C. and approximately 1100° C., for example, to approximately 1000° C., and the growth pressure is set between approximately 1 kPa and approximately 15 kPa, for example, to approximately 10 kPa.

Then, though not depicted, a resist mask having an opening in an element isolation region is formed, for example, using a photolithography technology, and element isolation is performed using the resist mask, for example, by dry etching using chlorine-based gas or an ion implantation method.

Figure 15:
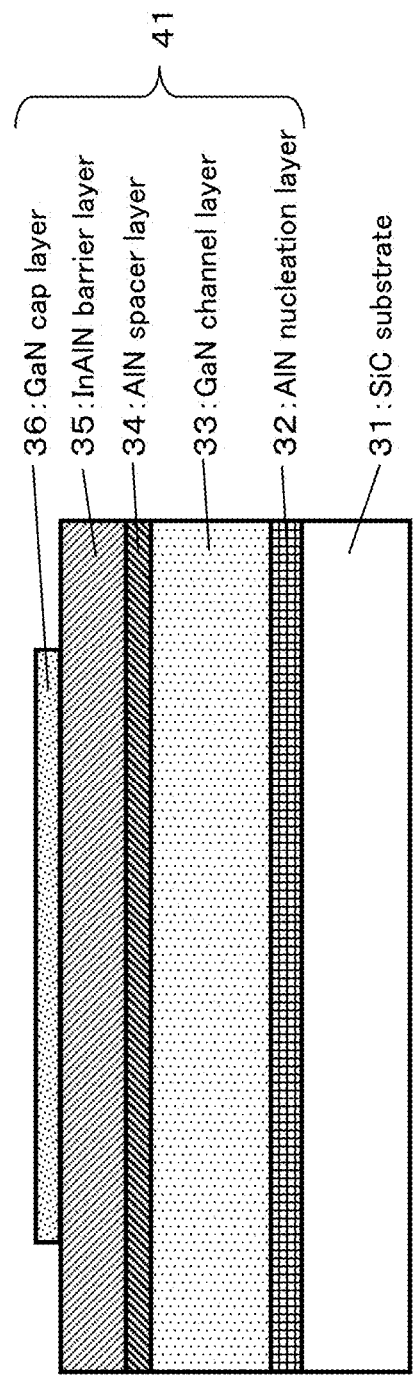

Then, a resist mask (not depicted) having openings in a scheduled source electrode formation region and a scheduled drain electrode formation region is formed, for example, using a photolithography technology. Then, using the resist mask, the GaN cap layer 36 in the scheduled source electrode formation region and the scheduled drain electrode formation region is removed as depicted in FIG. 15, for example, by dry etching using chlorine-based gas.

Figure 16:
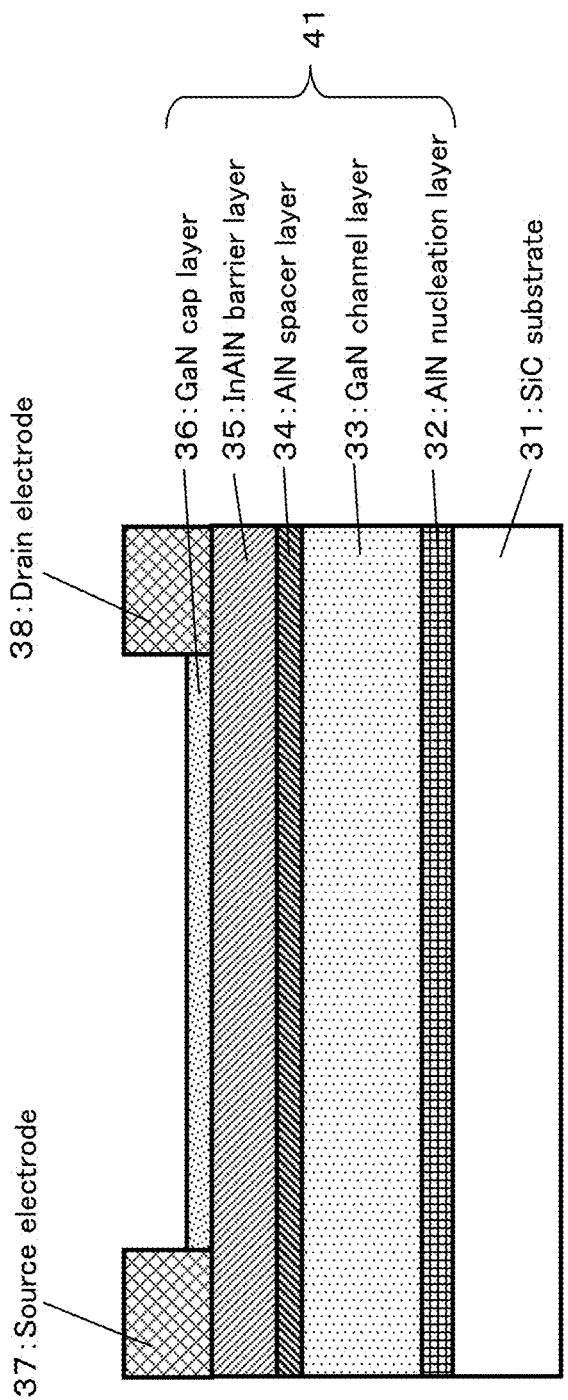

Thereafter, a source electrode 37 and a drain electrode 38 are formed in the scheduled source electrode formation region and the scheduled drain electrode formation region, respectively, for example, using a photolithography technology and a vapor deposition/liftoff technology as depicted in FIG. 16. In particular, the source electrode 37 and the drain electrode 38 made of Ta/Al are formed by stacking Ta and Al in order on the InAlN barrier layer 35. In this case, the thickness of Ta may be approximately 20 nm and the thickness of Al may be approximately 200 nm. Then, an ohmic characteristic is established by performing heat treatment at a temperature between approximately 400° C. and approximately 1000° C., for example, at 550° C., for example, in a nitride atmosphere.

Figure 17:
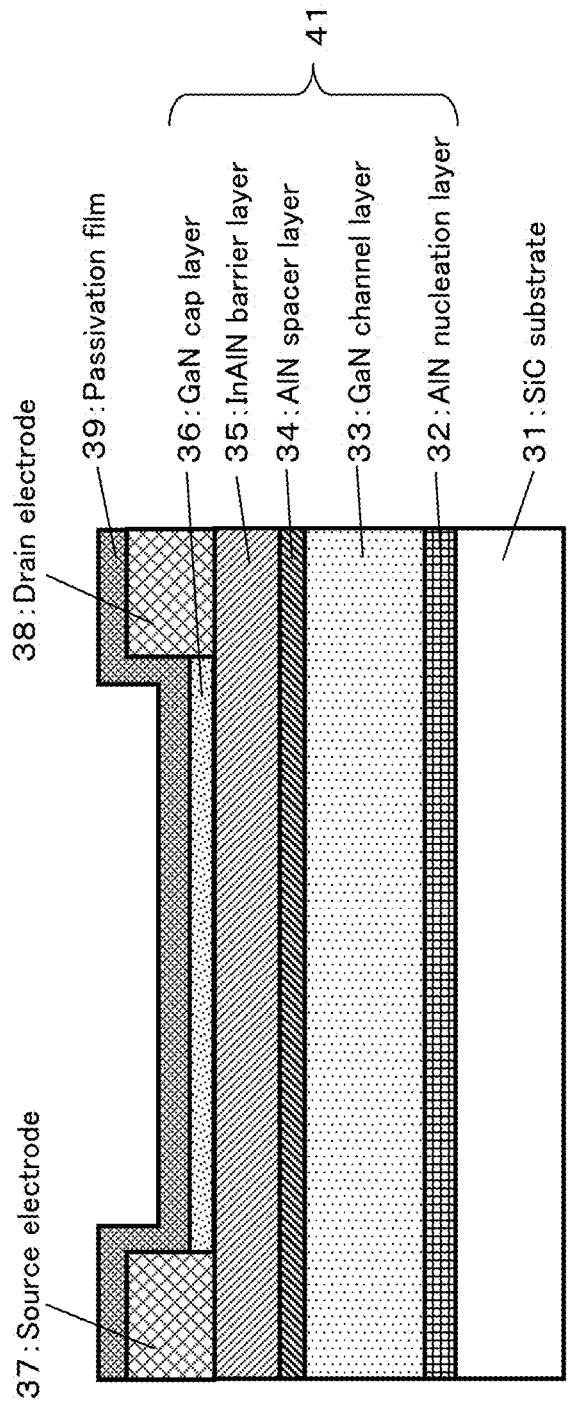

Then, a passivation film (insulating film) 39 is formed on the overall face of the wafer, for example, using a plasma CVD method as depicted in FIG. 17.

Here, the thickness of the passivation film 39 may be set between approximately 2 nm and approximately 500 nm, for example, to approximately 100 nm. Further, the passivation film 39 can be formed, for example, by using an ALD method, a plasma CVD method, a sputtering method or the like. Further, an oxide, a nitride or an oxynitride of Si, Al, Hf, Zr, Ti, Ta or W can be used as a material of the passivation film 39. For example, the passivation film 39 may be an SiN film.

Figure 18:
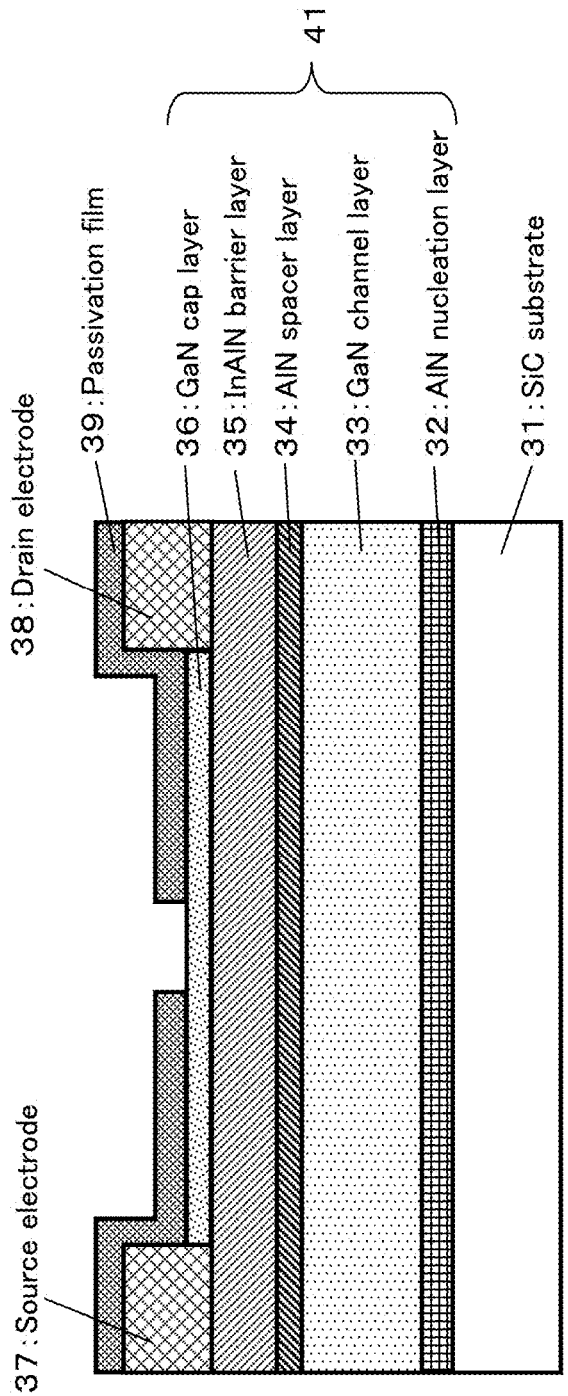

Then, a resist mask (not depicted) having an opening at part of a scheduled gate electrode formation region is formed, for example, using a photolithography technology. Then, using the resist mask, the passivation film 39 positioned at the opening is removed as depicted in FIG. 18, for example, by dry etching using fluorine gas or chlorine gas. It is to be noted that, as the etching method, for example, wet etching using hydrofluoric acid, buffered hydrofluoric acid or the like may be performed.

Then, a gate electrode 40 is formed in the scheduled gate electrode formation region, for example, using a photolithography technology and a vapor deposition/liftoff technology as depicted in FIG. 19. In particular, the gate electrode 40 made of Ni/Au is formed by stacking Ni and Au in order on the GaN cap layer 36. In this case, the thickness of Ni may be, for example, approximately 30 nm and the thickness of Au may be, for example, approximately 400 nm. In this manner, the gate electrode 40 is formed in contact with the GaN cap layer 36 to implement Schottky junction.

Thereafter, though not depicted, a compound semiconductor device (InAlN-HEMT) is completed, for example, by forming an interconnection, a pad and so forth.

It is to be noted that, while the second modification is described taking a case in which a Schottky type gate structure is provided as an example, an MIS type gate structure may be applied as in the first modification described above.

Further, while GaN is used for the cap layer in the second modification, AlGaN, InGaN, InAlGaN or the like may be used. However, in order to prevent a crack arising from distortion, it is preferable to set the Al composition to approximately 5% or less, and, in order to suppress increase of the sheet resistance arising from a piezoelectric field, it is preferable to set the In composition to approximately 10% or less. In particular, it is preferable to use a cap layer containing $In_{x2}Al_{y2}Ga_{1-x2-y2}N$ ($0<x2<0.1$, $0<y2\leq0.05$).

It is to be noted that, while, in the particular example of and first modification and second modification to the embodiment described above, an SiC substrate is list as an example of a substrate, the substrate is not limited to the SiC substrate and some other substrate such as, for example, a sapphire substrate, an Si substrate, a GaN substrate, a diamond substrate or the like may be used. Further, while a semi-insulating substrate is used here, the substrate is not limited to this, and, for example, a substrate having conductivity such as n-type conductivity or p-type conductivity may be used.

Further, the semiconductor stacked structure is not limited to those of the embodiment, particular example of the embodiment, first modification and second modification described above, and any other semiconductor stacked structure may be applied if it includes a channel layer, a spacer layer (nitride semiconductor layer) and a barrier layer. For example, a nitride semiconductor stacked structure in which a field-effect transistor such as a field-effect transistor for which a nitride semiconductor is used may be applied. It is to be noted that the nitride semiconductor stacked structure is referred to also as semiconductor epitaxial structure.

For example, while InAlN is used for the barrier layer, AlGaN, InAlGaN or the like may be used. However, in order to achieve higher spontaneous polarization, it is preferable to set the In composition lower than approximately 20%. In particular, it is preferable to use a barrier layer containing $In_{x1}Al_{y1}Ga_{1-x1-y1}N$ ($0 \leq x1 < 0.20$, $0 < y1 \leq 1$).

Further, the layer structures of the gate electrode, source electrode and drain electrode in the particular example of and the first modification and the second modification to the embodiment described above are an example and are not limited to those described above, and a different layer structure may be applied. For example, the layer structures of the gate electrode, source electrode and drain electrode in the particular example of and the first modification and the second modification to the embodiment described above may be a single layer or a multilayer. Further, the formation method for the gate electrode, source electrode and drain electrode in the particular example of and the first modification and the second modification to the embodiment described above is nothing but an example, and the gate electrode, source electrode and drain electrode may be formed by any other method.

Further, while, in the particular example of and the first modification and the second modification to the embodiment described above, in order to obtain an ohmic characteristic of the source electrode and the drain electrode, heat treatment is performed, the method for obtaining an ohmic characteristic is not limited to this. If an ohmic characteristic can be obtained without performing heat treatment, then heat treatment for obtaining an ohmic characteristic of the source electrode and the drain electrode may not be performed. Further, while heat treatment is not performed for the gate electrode here, heat treatment may be performed for the gate electrode.

Second Embodiment

Now, a compound semiconductor device, a fabrication method therefor and a power supply apparatus according to a second embodiment are described with reference to FIGS. 20 and 21.

The compound semiconductor device according to the present embodiment is a semiconductor package that includes, as a semiconductor chip, the compound semiconductor device (InAlGaN-based HEMT) in one of the first embodiment, particular example and modifications described above. It is to be noted that the semiconductor chip is referred to also as HEMT chip or transistor chip.

The present embodiment is described below taking a discrete package as an example.

Figure 20:
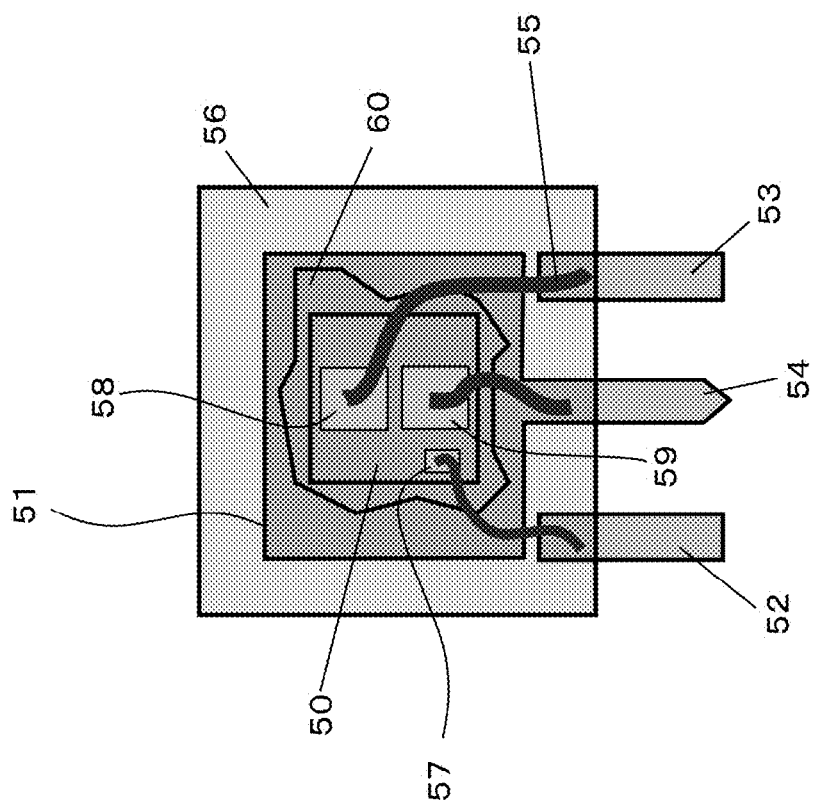
FIG. 20 is a schematic top plan view depicting a configuration of a compound semiconductor device (semiconductor package) according to a second embodiment.

As depicted in FIG. 20, the present compound semiconductor device includes a stage 51 on which a semiconductor chip 50 of one of the first embodiment, particular example and modifications described above is incorporated, a gate lead 52, a source lead 53, a drain lead 54, a bonding wire 55 (here, Al wires) and an encapsulation resin 56. It is to be noted that the encapsulation resin is referred to also as a molding resin.

A gate pad 57, a source pad 58 and a drain pad 59 of the semiconductor chip 50 mounted on the stage 51 are coupled to the gate lead 52, source lead 53 and drain lead 54 by the Al wires 55, respectively, which then undergoes resin encapsulation.

Here, the stage 51 to which the back face of the substrate of the semiconductor chip 50 is fixed by die attach agent 60 (here, solder) is electrically coupled with the drain lead 54.

It is to be noted that the embodiment is not limited to this, and the stage 51 may be electrically coupled with the source lead 53.

Now, a fabrication method for the compound semiconductor device (discrete package) according to the present embodiment is described.

First, the semiconductor chip 50 (InAlGaN-based HEMT) according to one of the first embodiment, particular example and modifications described hereinabove is fixed to the stage 51 of the lead frame, for example, using die attach material 60 (here, solder).

Then, the gate pad 57, drain pad 59 and source pad 58 of the semiconductor chip 50 are coupled with the gate lead 52, drain lead 54 and source lead 53, respectively, for example, by bonding using the Al wires 55.

Thereafter, resin encapsulation is performed, for example, by a transfer mold method, and then, the lead frame is separated.

A compound semiconductor device (discrete package) can be fabricated in this manner.

It is to be noted, while the compound semiconductor device here is described taking a discrete package in which the pads 57 to 59 of the semiconductor chip 50 are used as bonding pads for wire bonding, as an example, the compound semiconductor device is not limited to this and some other semiconductor package may be applied. For example, a semiconductor package may be applied in which pads of a semiconductor chip are used as bonding pads for wireless bonding such as, for example, flip chip bonding. Or, a wafer level package may be applied. Or else, a semiconductor package other than a discrete package may be applied.

Now, a power supply apparatus that includes a semiconductor package including the InAlGaN-based HEMT described above is described with reference to FIG. 21.

In the following, description is given taking a case in which the InAlGaN-based HEMT included in the semiconductor package described above is used for a PFC (power factor correction) circuit provided in a power supply apparatus used for a server as an example.

Figure 21:
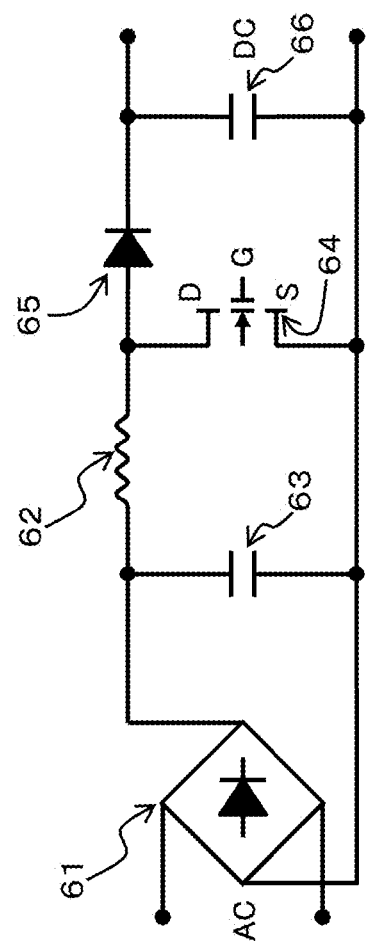
FIG. 21 is a schematic view depicting a configuration of a PFC circuit included in a power supply apparatus according to the second embodiment.

As depicted in FIG. 21, the present PFC circuit includes a diode bridge 61, a choke coil 62, a first capacitor 63, an InAlGaN-based HEMT 64 included in the semiconductor package described above, a diode 65 and a second capacitor 66.

Here, the present PFC circuit is configured by mounting the diode bridge 61, choke coil 62, first capacitor 63, InAlGaN-based HEMT 64 included in the semiconductor package described above, diode 65 and second capacitor 66 on a circuit board.

In the present embodiment, the drain lead 54, source lead 53 and gate lead 52 of the semiconductor package described above are inserted in a drain lead insertion portion, a source lead insertion portion and a gate lead insertion portion of the circuit board, respectively, and are fixed, for example, by solder or the like. The InAlGaN-based HEMT 64 included in the semiconductor package described above is coupled to the PFC circuit formed on the circuit board in this manner.

Further, in the present PFC circuit, one of terminals of the chock coil 62 and an anode terminal of the diode 65 are connected to a drain electrode D of the InAlGaN-based HEMT 64. Further, one of terminals of the first capacitor 63 is connected to the other terminal of the chock coil 62, and one of terminals of the second capacitor 66 is connected to a cathode terminal of the diode 65. Further, the other terminal of the first capacitor 63, a source electrode S of the InAlGaN-based HEMT 64 and the other terminal of the second capacitor 66 are grounded. Further, a pair of terminals of the diode bridge 56 are connected to the opposite terminals of the first capacitor 63, and the other pair of terminals of the diode bridge 61 are coupled to input terminals to which an alternating current (AC) voltage is inputted. Further, the opposite terminals of the second capacitor 66 are connected to output terminals from which a direct current (DC) voltage is outputted. Further, a gate driver not depicted is coupled to a gate electrode G of the InAlGaN-based HEMT 64. In the present PFC circuit, by driving the InAlGaN-based HEMT 64 by the gate driver, the AC voltage inputted from the input terminals is converted into a DC voltage and then outputted from the output terminals.

Accordingly, with the power supply apparatus according to the present embodiment, there is an advantage that the reliability can be improved. In particular, since the semiconductor chip in one of the first embodiment, particular example and modifications described above is provided, there is an advantage that a power supply apparatus having high reliability can be constructed.

It is to be noted that, while the foregoing description is given taking a case wherein the compound semiconductor device described hereinabove (semiconductor chip or semiconductor package including the InAlGaN-based HEMT) is used for a PFC circuit provided in a power supply apparatus used for a server as an example, the embodiment is not limited to this. For example, the compound semiconductor device described above (semiconductor chip or semiconductor package including the InAlGaN-based HEMT) may be used for electronic equipment (electronic device) such as a computer other than a server. Further, the compound semiconductor device described hereinabove (semiconductor chip or semiconductor package including the InAlGaN-based HEMT) may be used for some other circuit (for example, a DC-DC converter or the like) provided in a power supply apparatus.

Third Embodiment

Now, a high-output amplifier according to the third embodiment is described with reference to FIG. 22.

The high-output amplifier according to the present embodiment is a high-output amplifier (high-frequency amplifier) including one of the compound semiconductor devices of the first embodiment, particular example and modifications described hereinabove.

Figure 22:
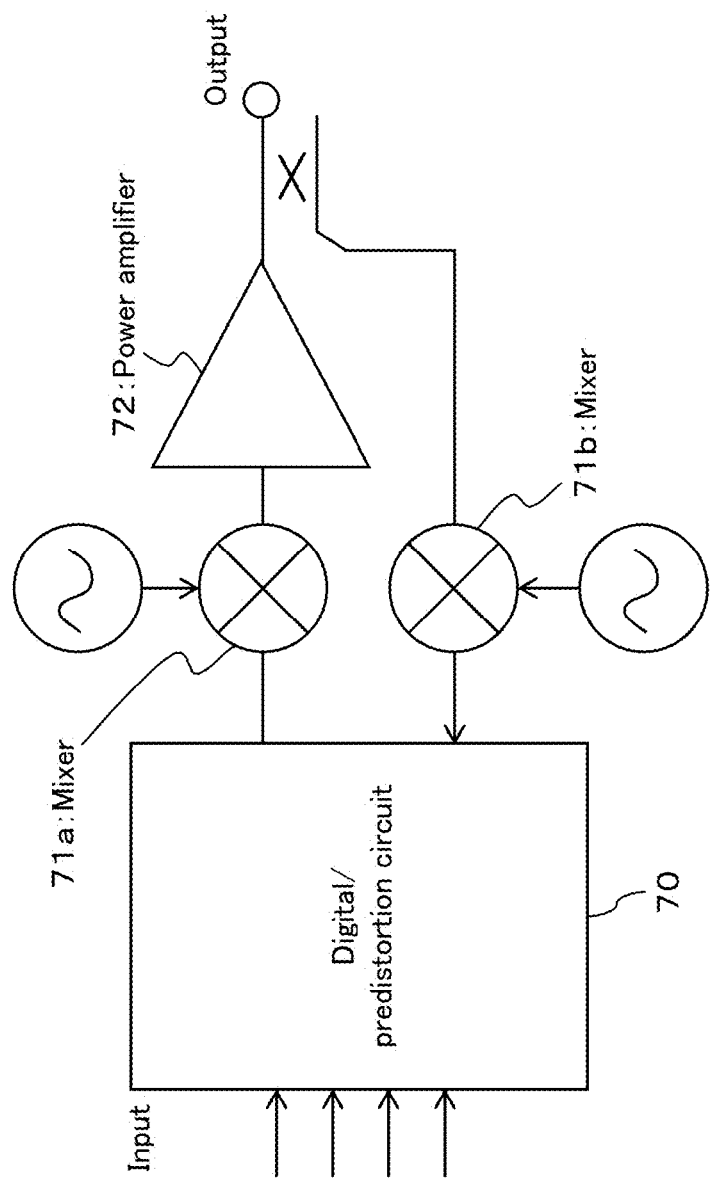
FIG. 22 is a schematic view depicting a configuration of a high-output amplifier of a third embodiment.

As depicted in FIG. 22, the present high-output amplifier includes a digital/predistortion circuit 70, mixers 71a and 71b and a power amplifier 72. It is to be noted that a power amplifier is referred to also as amplifier simply.

The digital/predistortion circuit 70 compensates for non-linear distortion of an input signal.

The mixers 71a and 71b perform mixing of the input signal whose non-linear distortion is compensated for and an alternating current signal.

The power amplifier 72 amplifies the input signal after mixing with the alternating current signal and includes one of the compound semiconductor devises of the first embodiment, particular example and modifications described hereinabove, namely, a semiconductor chip including an InAlGaN-based HEMT. It is to be noted that the semiconductor chip is referred to also as HEMT chip or transistor chip.

It is to be noted that, in FIG. 22, the high-output amplifier is configured such that, for example, by changeover of a switch, a signal at the output side can be mixed with an alternating current signal by the mixer 71b and sent out to the digital/predistortion circuit 70.

Accordingly, with the high-output amplifier according to the present embodiment, there is an advantage that, since the compound semiconductor device according to any of the first embodiment, particular example and modifications described hereinabove is applied to the power amplifier 72, a high-output amplifier having high reliability can be implemented.

[Others]

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor substrate, comprising:
a substrate;
a channel layer provided over the substrate;
a spacer layer provided over the channel layer; and
a barrier layer provided on the spacer layer; wherein
a length of a c axis of the spacer layer is 0.4990 nm or more, and
the spacer layer have a higher Al composition than that of the barrier layer.

2. The compound semiconductor substrate according to claim 1, wherein the spacer layer contains AlN.

3. The compound semiconductor substrate according to claim 1, wherein the barrier layer contains $In_{x1}Al_{y1}Ga_{1-x1-y1}N$ (0<x1<0.20, 0<y1≤1).

4. The compound semiconductor substrate according to claim 1, wherein the channel layer contains GaN.

5. The compound semiconductor substrate according to claim 1, wherein a thickness of the spacer layer is 2 nm or less.

6. The compound semiconductor substrate according to claim 1, wherein an arithmetical average roughness Ra of a surface of the barrier layer is 0.25 nm or less.

7. The compound semiconductor substrate according to claim 1, further comprising a cap layer provided on the barrier layer.

8. The compound semiconductor substrate according to claim 7, wherein the cap layer contains $In_{x2}Al_{y2}Ga_{1-x2-y2}N$ (0<x2<0.1, 0<y2≤0.05).

9. A compound semiconductor device, comprising:
a substrate;
a channel layer provided over the substrate;
a spacer layer provided over the channel layer;
a barrier layer provided on the spacer layer; and
a gate electrode, a source electrode and a drain electrode provided over the barrier layer; wherein
a length of a c axis of the spacer layer is 0.4990 nm or more, and
the spacer layer have a higher Al composition than that of the barrier layer.

10. The compound semiconductor device according to claim 9, wherein the spacer layer contains AlN.

11. The compound semiconductor device according to claim 9, wherein the barrier layer contains $In_{x1}Al_{y1}Ga_{1-x1-y1}N$ (0<x1<0.20, 0<y1≤1).

12. A power supply apparatus, comprising:
a transistor chip; wherein
the transistor chip includes:
a substrate;
a channel layer provided over the substrate;
a spacer layer provided over the channel layer;
a barrier layer provided on the spacer layer; and
a gate electrode, a source electrode and a drain electrode provided over the barrier layer; wherein
a length of a c axis of the spacer layer is 0.4990 nm or more, and
the spacer layer have a higher Al composition than that of the barrier layer.

13. A high-output amplifier, comprising:
an amplifier that amplifies an inputting signal; wherein
the amplifier includes a transistor chip;
the transistor chip includes:
a substrate;
a channel layer provided over the substrate;
a spacer layer provided over the channel layer;
a barrier layer provided on the spacer layer; and
a gate electrode, a source electrode and a drain electrode provided over the barrier layer; wherein
a length of a c axis of the spacer layer is 0.4990 nm or more, and
the spacer layer have a higher Al composition than that of the barrier layer.

* * * * *